(12) United States Patent
Lee

(10) Patent No.: US 12,232,392 B2
(45) Date of Patent: Feb. 18, 2025

(54) DISPLAY APPARATUS USING INORGANIC LIGHT-EMITTING DIODE

(71) Applicant: LG ELECTRONICS INC., Seoul (KR)

(72) Inventor: Jaehyuk Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 336 days.

(21) Appl. No.: 17/778,659

(22) PCT Filed: Dec. 3, 2019

(86) PCT No.: PCT/KR2019/016906
§ 371 (c)(1),
(2) Date: May 20, 2022

(87) PCT Pub. No.: WO2021/100955
PCT Pub. Date: May 27, 2021

(65) Prior Publication Data
US 2022/0415977 A1 Dec. 29, 2022

(30) Foreign Application Priority Data
Nov. 22, 2019 (KR) ........................ 10-2019-0151505

(51) Int. Cl.
*H10K 59/35* (2023.01)
(52) U.S. Cl.
CPC .................................. *H10K 59/353* (2023.02)
(58) Field of Classification Search
CPC .............................. H10K 59/353; H10K 59/60
See application file for complete search history.

(56) References Cited

U.S. PATENT DOCUMENTS 10,720,607 B2 * 7/2020 Song .................... H10K 59/879
2007/0205423 A1 * 9/2007 Yamazaki .............. H10K 59/00
428/917

(Continued)

FOREIGN PATENT DOCUMENTS

CN      105070744 A    11/2015
CN      108878493 A    11/2018

(Continued)

OTHER PUBLICATIONS

Machine Translation of CN-109037291-A.*
Better translation of CN 109037291 A.*
Translation of KR 10-2015-0079127.*

*Primary Examiner* — Suberr L Chi
(74) *Attorney, Agent, or Firm* — Birch, Stewart, Kolasch & Birch, LLP

(57) ABSTRACT

The present disclosure relates to a display apparatus using, for example, a micro light emitting diode (LED), and a manufacturing method therefor, wherein the apparatus and method can be applied to a technical field related to display apparatuses. According to the present disclosure, a display apparatus using a light-emitting device comprises: a first electrode which is divided into a plurality of segments; a common second electrode located on the first electrode; and a plurality of sub pixels electrically connected between the first electrode segments and the second electrode and forming individual pixels, wherein the sub pixels may include a first sub pixel which emits light of a first color and includes an organic light-emitting device, a second sub pixel which emits light of a second color and includes an organic light-emitting device, a third sub pixel which emits light of a third color and includes an inorganic light-emitting device, and a fourth sub pixel which includes an organic light-emitting device for emitting light which is a mixture of the light of the first to third colors.

11 Claims, 32 Drawing Sheets

(56) References Cited

U.S. PATENT DOCUMENTS

2016/0064363 A1    3/2016   Bower et al.
2017/0179092 A1    6/2017   Sasaki et al.

FOREIGN PATENT DOCUMENTS

| | | | | |
|---|---|---|---|---|
| CN | 109037291 A | * | 12/2018 | .......... H01L 27/3211 |
| EP | 3 544 386 A1 | | 9/2019 | |
| KR | 10-2012-0009830 A | | 2/2012 | |
| KR | 10-2015-0079127 A | | 7/2015 | |
| KR | 2015-0079127 A | * | 7/2015 | ............. H01L 27/32 |
| KR | 10-2018-0055549 A | | 5/2018 | |

* cited by examiner

DISPLAY APPARATUS USING INORGANIC LIGHT-EMITTING DIODE

CROSS REFERENCE TO RELATED APPLICATIONS

This application is the National Stage filing under 35 U.S.C. 371 of International Application No. PCT/KR2019/016906, filed on Dec. 3, 2019, which claims the benefit of earlier filing date and right of priority to Korean Application No. 10-2019-0151505, filed on Nov. 22, 2019, the entire contents of all these applications are all hereby expressly incorporated by reference into the present application.

TECHNICAL FIELD

The present disclosure is applicable to a display device-related technical field, and relates, for example, to a display device using a micro LED (light emitting diode) and a method for manufacturing the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

Meanwhile, as is generally known in the art, OLED displays are very vulnerable to light, heat, or moisture due to the characteristics of the organic constituents contained in the material thereof, and thus have a problem in that an OLED emission layer is easily degraded. However, it is difficult to substantially alleviate this degradation phenomenon at present. Therefore, attempts are being made to improve brightness through structural improvement, for example, addition of white (W) subpixels.

The shorter the wavelength of the light emitted from the OLED, the greater the degradation in the luminance of the OLED display. That is, a blue element (a blue organic emission layer) is degraded more over time.

Degradation of the blue element may entail a problem of occurrence of yellowing of the screen of the display. That is, the entire area of the screen of the display appears yellowish. This may be caused by a red-shift phenomenon, which results from reduction in the luminance of blue light due to degradation of the blue element.

Therefore, there is a need to overcome the above problems with OLED displays.

DISCLOSURE

Technical Task

A technical task of the present disclosure is to provide a display device using a light-emitting element and a method of manufacturing the same that are capable of dramatically improving the reliability thereof while maintaining the advantages of organic light-emitting diodes.

Specifically, a technical task of the present disclosure is to provide a display device using a light-emitting element and a method of manufacturing the same that are capable of solving a red-shift phenomenon attributable to degradation of a blue subpixel of an organic light-emitting diode display.

Technical Solutions

In accordance with a first aspect for accomplishing the above objects, a display device using a light-emitting element may include a plurality of segmented first electrodes, a second electrode, which is a common electrode located above the first electrodes, and a plurality of subpixels, each of which is disposed between and is electrically connected to a respective one of the first electrodes and the second electrode to constitute an individual pixel. The plurality of subpixels may include a first subpixel configured to emit light of a first color and including an organic light-emitting diode, a second subpixel configured to emit light of a second color and including an organic light-emitting diode, a third subpixel configured to emit light of a third color and including an inorganic light-emitting diode, and a fourth subpixel including an organic light-emitting diode configured to emit light in which the light of the first color to the light of the third color are mixed.

In addition, a conductive adhesive layer may be disposed on at least one side surface of the inorganic light-emitting diode.

In addition, the conductive adhesive layer may be white or black.

In addition, the conductive adhesive layer may include a dye of any one of the first color to the third color.

In addition, a fifth subpixel configured to emit light of the third color and including an organic light-emitting diode may be further included.

In addition, the third color may be blue.

In addition, at least one of the third subpixel or the fourth subpixel may have a size smaller than the size of the first subpixel or the second subpixel.

In addition, a height compensation layer configured to compensate for the height difference between the inorganic light-emitting diode and one of the organic light-emitting diodes may be further included.

In accordance with a second aspect for accomplishing the above objects, a display device using a light-emitting element may include a plurality of segmented first electrodes, a second electrode, which is a common electrode located above the first electrodes, a plurality of subpixels, each of which is disposed between and is electrically connected to a respective one of the first electrodes and the second electrode to constitute an individual pixel and which include a first subpixel configured to emit light of a first color and including an organic light-emitting diode, a second subpixel configured to emit light of a second color and including an organic light-emitting diode, and a third subpixel configured to emit light of a third color and including an inorganic light-emitting diode, and a height compensation layer configured to compensate for the height difference between the inorganic light-emitting diode and one of the organic light-emitting diodes.

Advantageous Effects

According to an embodiment of the present disclosure, there are the following effects.

First, a hybrid light-emitting array structure in which an organic light-emitting diode and an inorganic light-emitting diode are arranged in combination may be provided.

In addition, a display device having such a hybrid light-emitting array structure is capable of exhibiting dramatically improved reliability while maintaining the advantages of organic light-emitting diodes.

Consequently, it is possible to overcome one of the major problems with a display device using an OLED, thereby greatly improving the productivity and quality thereof.

Furthermore, according to another embodiment of the present disclosure, there are additional effects not mentioned herein. Those of ordinary skill in the art may understand it through the full text of the specification and drawings.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and a redundant description thereof will be omitted. As used herein, the suffixes "module" and "unit" are added or used interchangeably to facilitate preparation of this specification, and are not intended to suggest distinct meanings or functions. In describing embodiments disclosed in this specification, relevant well-known technologies may not be described in detail in order to avoid obscuring the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining two or more drawings are also within the scope of the present disclosure.

In addition, when an element such as a layer, a region, or a substrate is described as being "on" another element, it is to be understood that the element may be directly on the other element, or there may be an intermediate element between them.

The display device described herein conceptually includes all display devices that display information with a unit pixel or a set of unit pixels. Therefore, the term "display device" may be applied not only to finished products but also to parts. For example, a panel corresponding to a part of a digital TV also independently corresponds to the display device in the present specification. Such finished products include a mobile phone, a smartphone, a laptop computer, a digital broadcasting terminal, a personal digital assistant (PDA), a portable multimedia player (PMP), a navigation system, a slate PC, a tablet PC, an Ultrabook, a digital TV, a desktop computer, and the like.

However, it will be readily apparent to those skilled in the art that the configuration according to the embodiments described herein is also applicable to new products to be developed later as display devices.

In addition, the term "semiconductor light-emitting element" mentioned in this specification conceptually includes an LED, a micro LED, and the like, and may be used interchangeably therewith.

Figure 1:
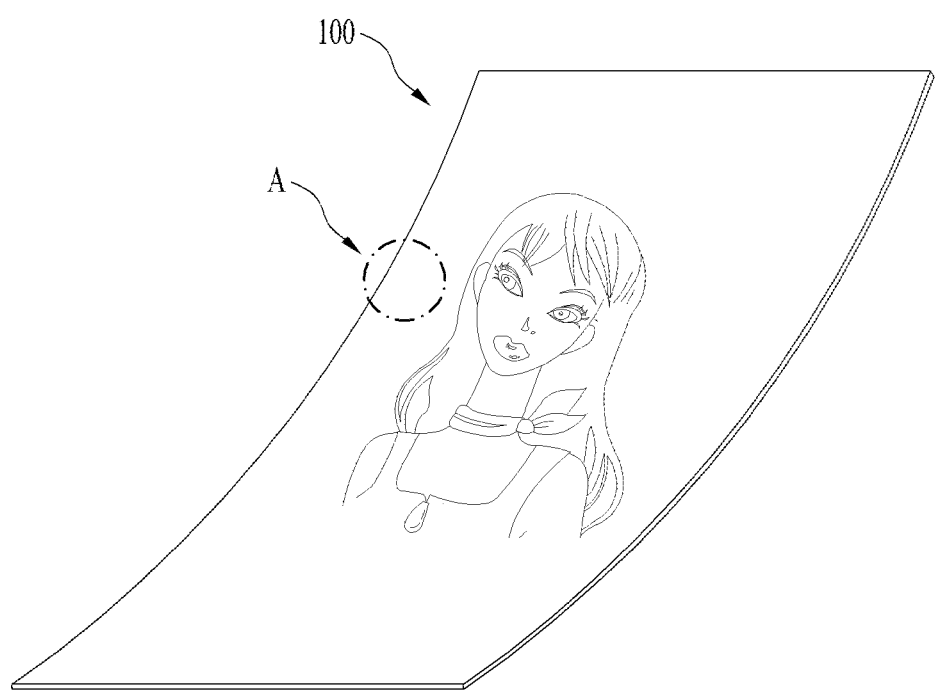
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of subpixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
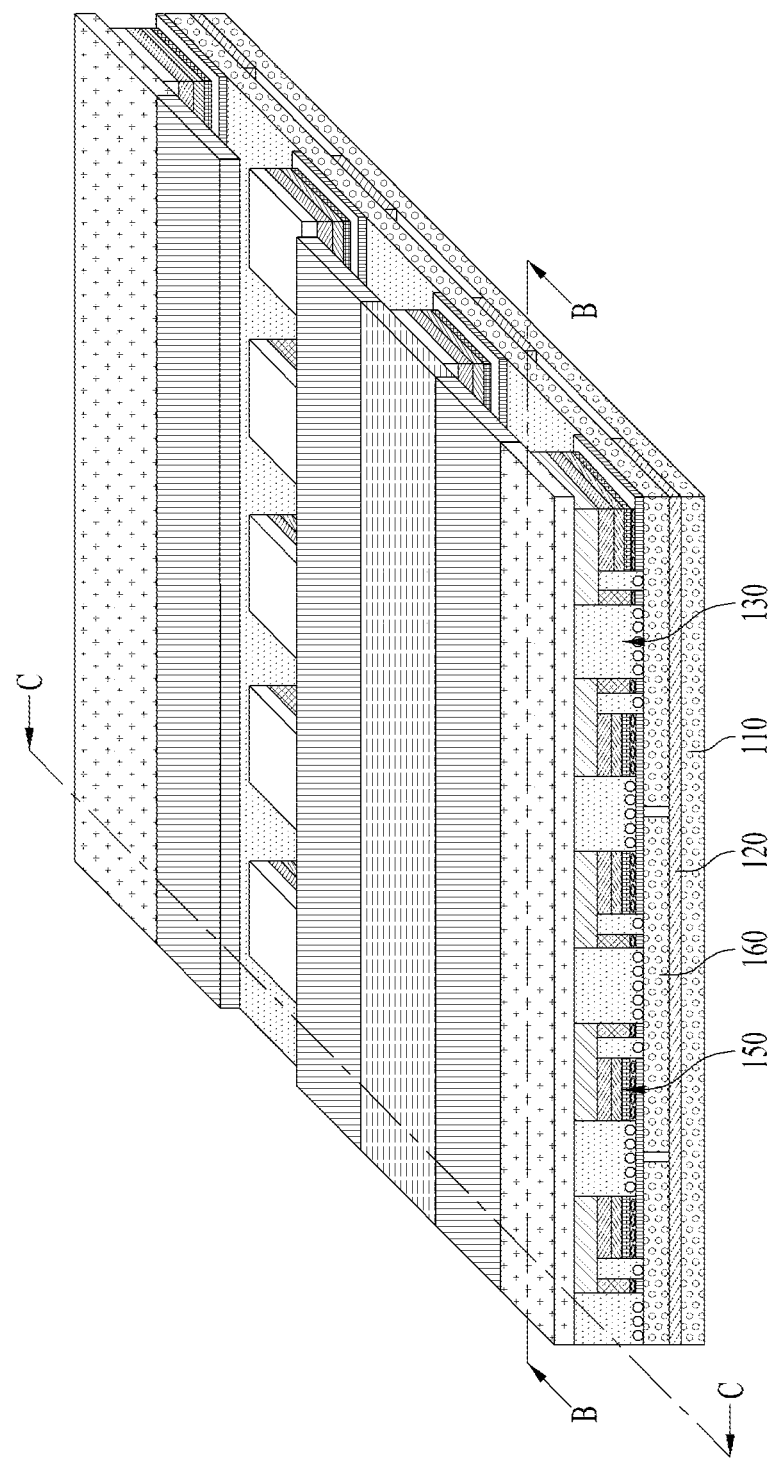
FIG. 2 is a partially enlarged diagram showing a part A shown in FIG. 1.

FIG. 2 is a partially enlarged view showing part A of FIG. 1.

Figure 3A:
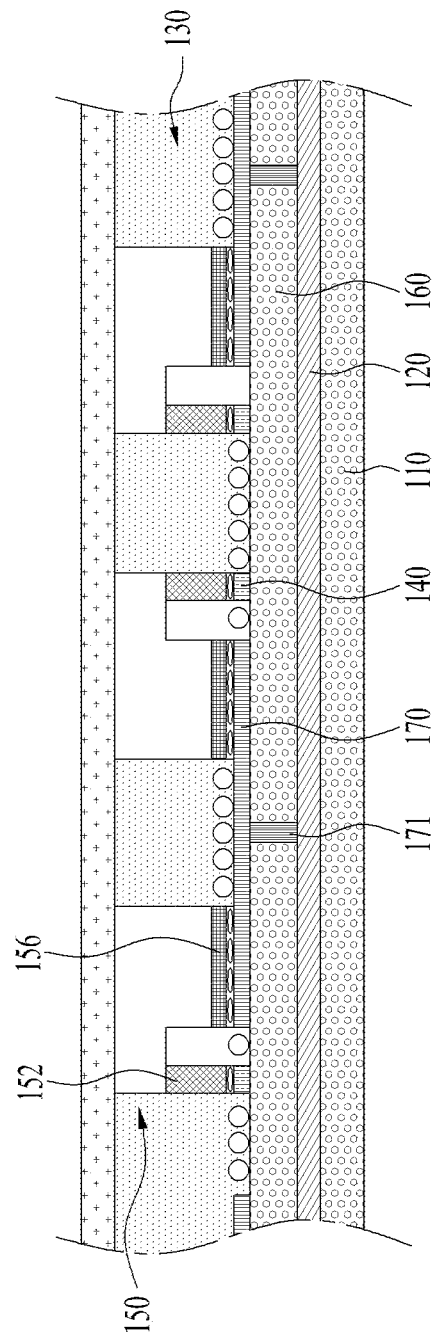
FIGS. 3A and 3B are cross-sectional diagrams taken along the cutting lines B-B and C-C in FIG. 2.
Figure 3B:
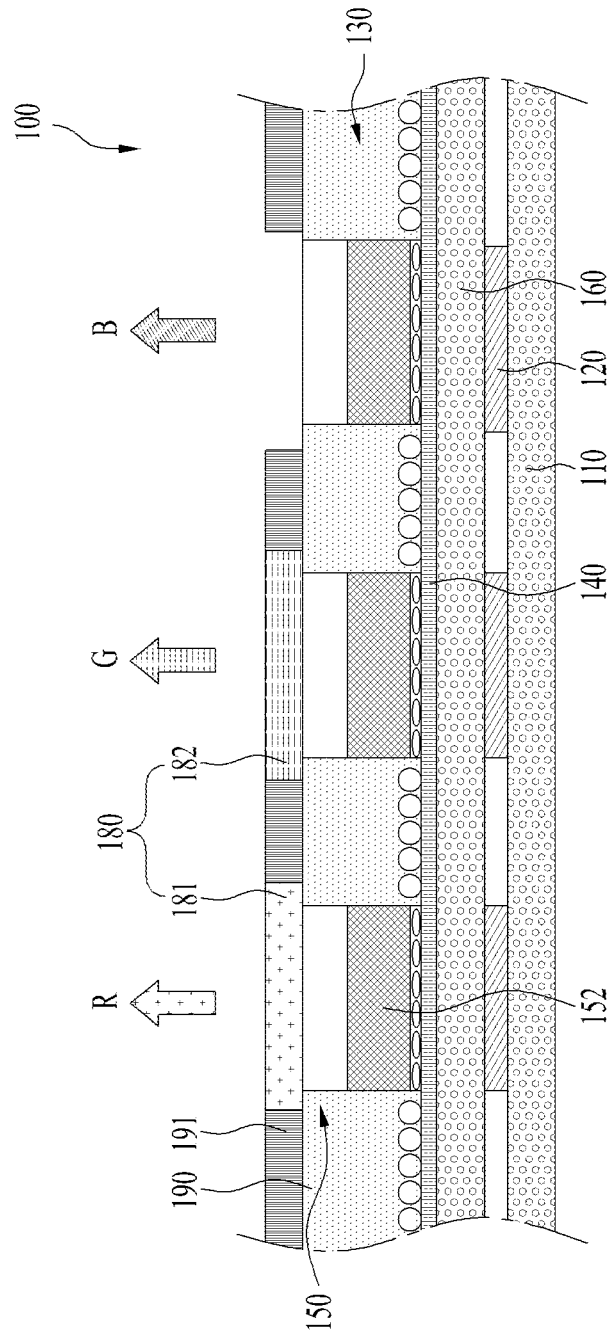

FIGS. 3A and 3B are cross-sectional views taken along lines B-B and C-C in FIG. 2.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Figure 4:
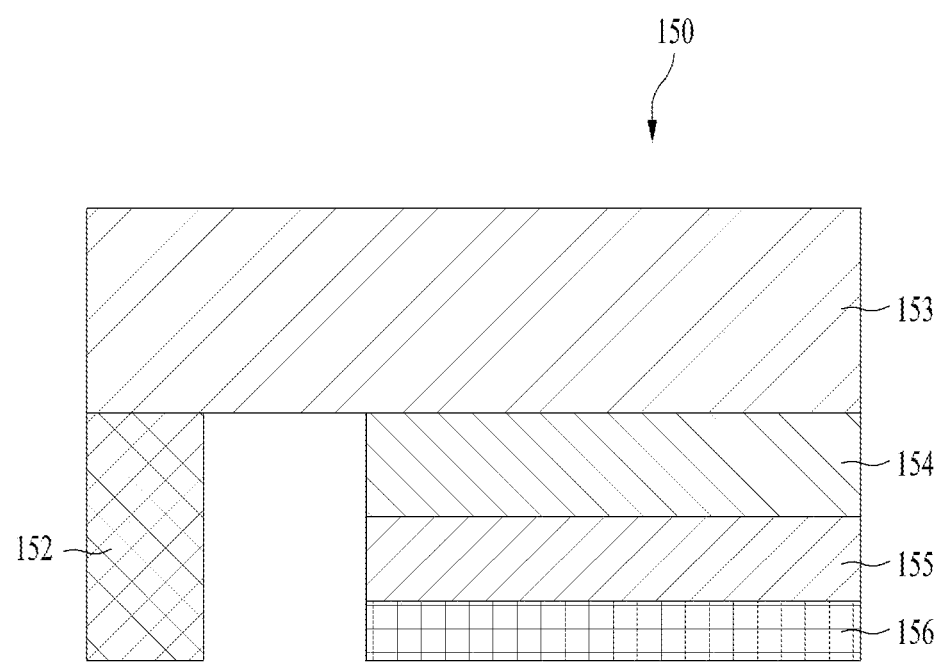
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIGS. 3A and 3B, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Figure 5A:
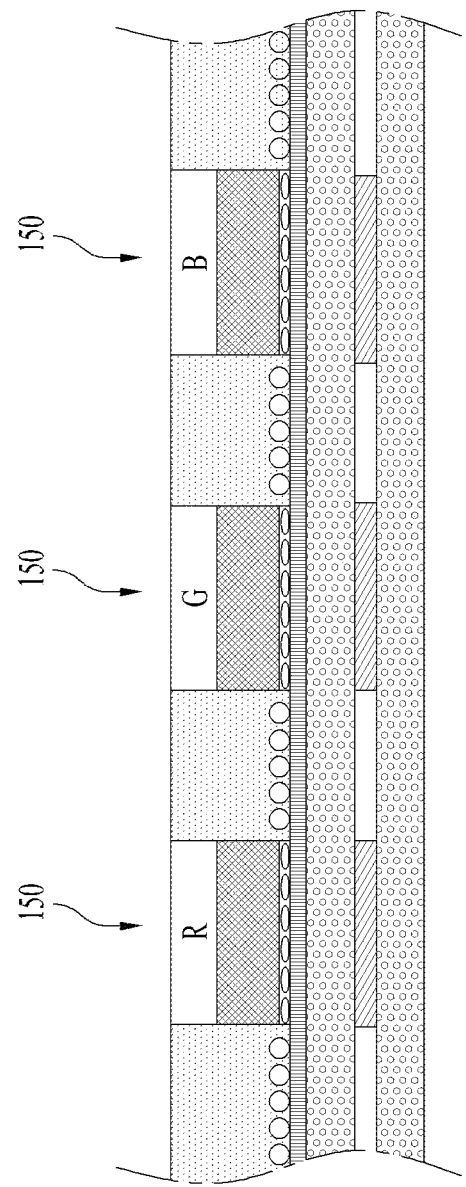
FIGS. 5A to 5C are conceptual diagrams illustrating various examples of color implementation with respect to a flip-chip type semiconductor light emitting element.
Figure 5B:
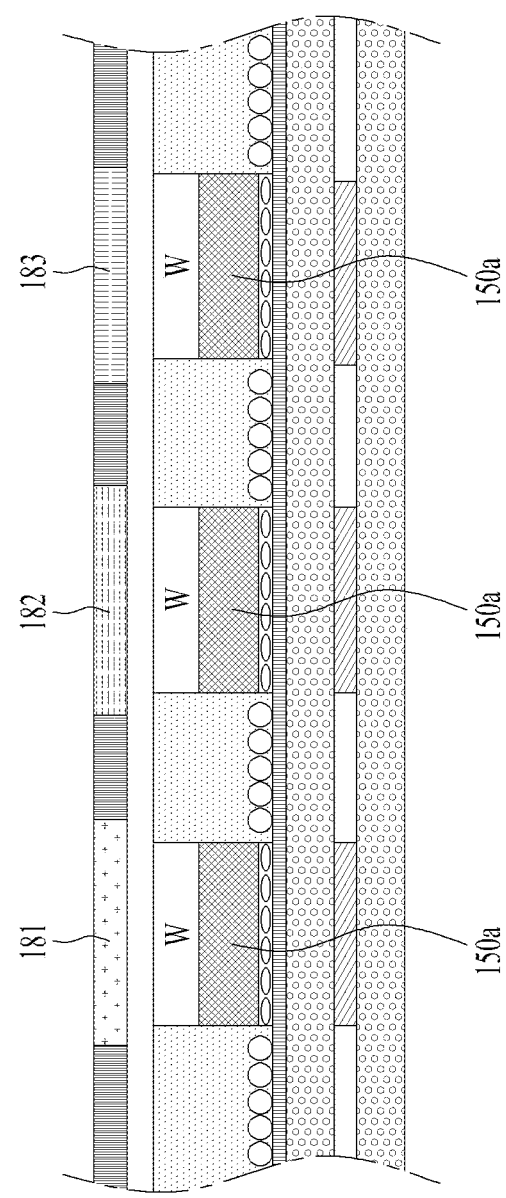
Figure 5C:
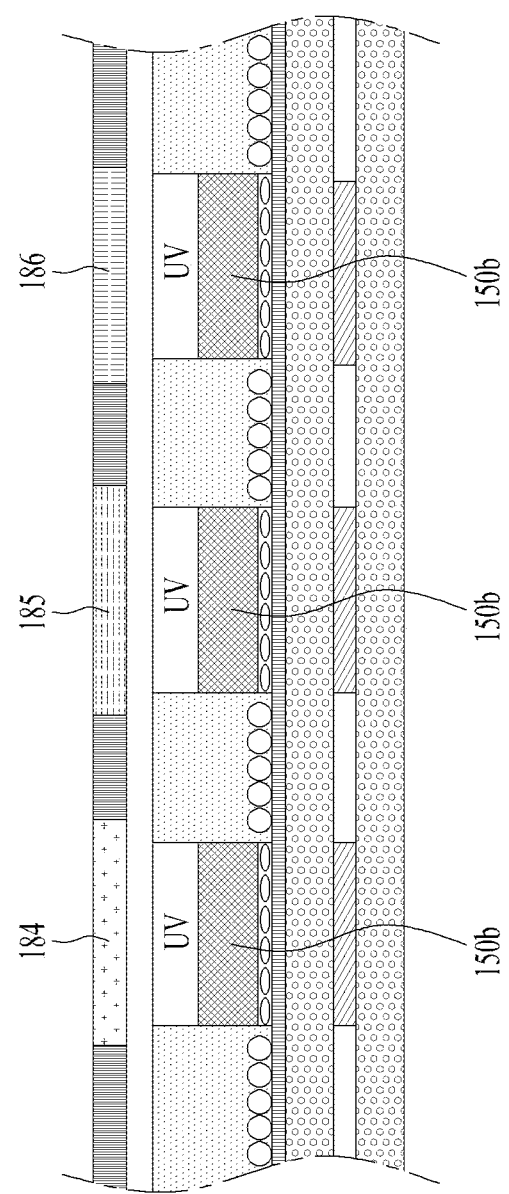

FIGS. 5A to 5C are conceptual views illustrating various examples of implementation of colors in relation to a flip-chip type semiconductor light emitting element.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (subpixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on an ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
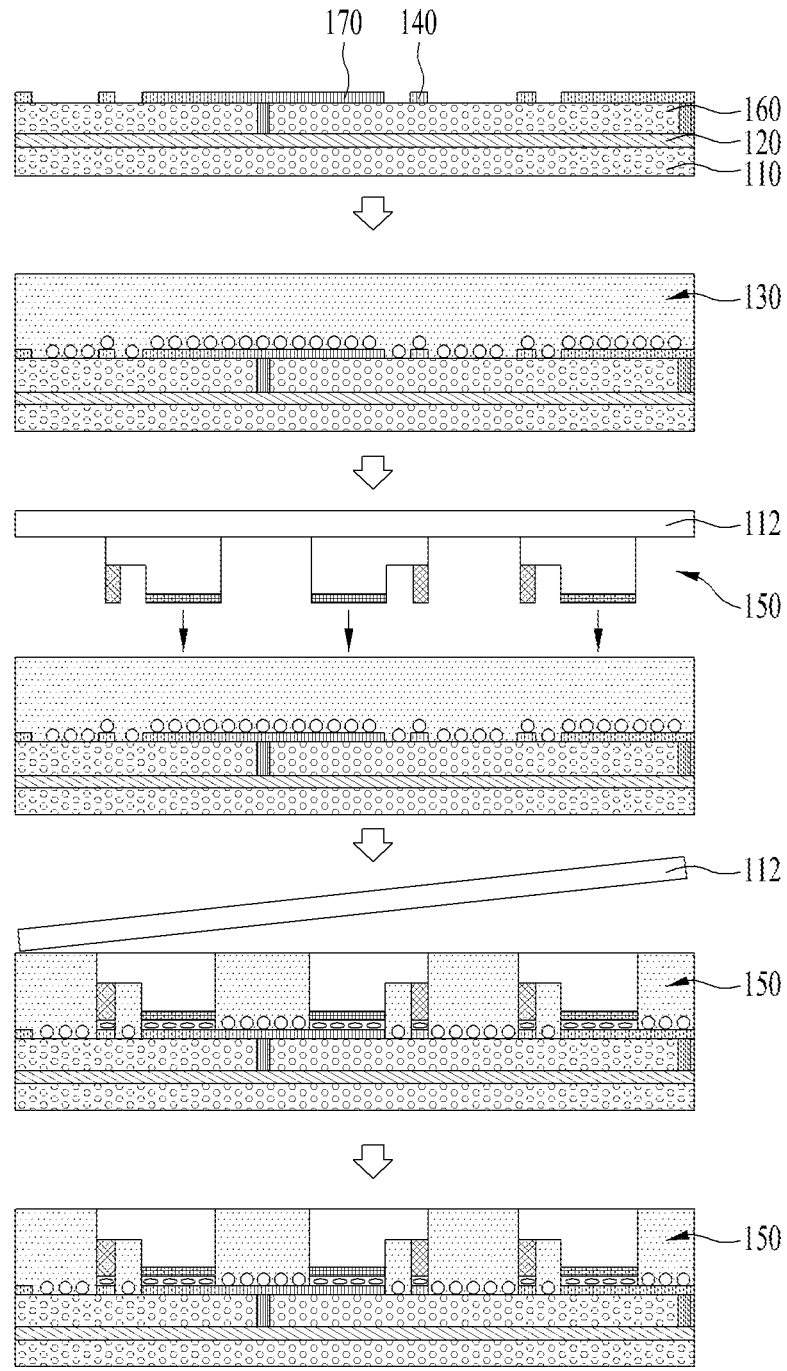
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
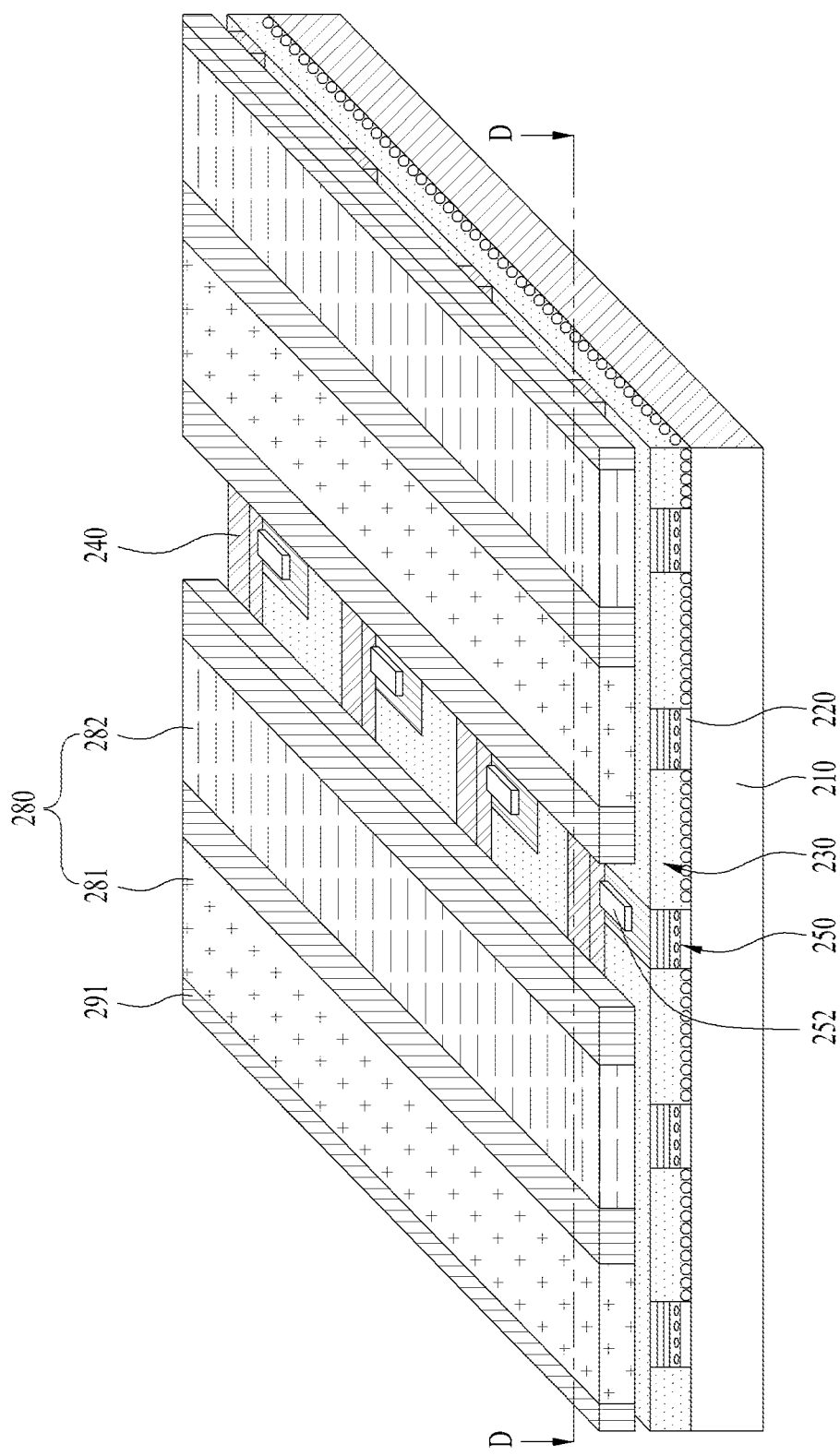
FIG. 7 is a perspective diagram of a display device using a semiconductor light emitting element according to another embodiment of the present disclosure.
Figure 8:
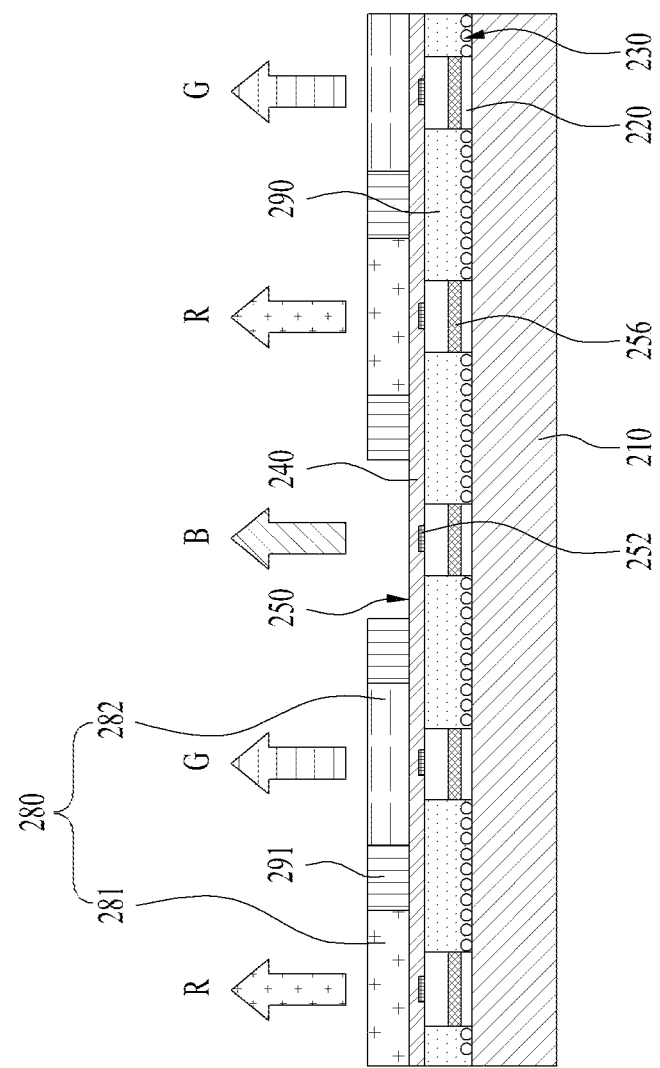
FIG. 8 is a cross-sectional diagram taken along a cutting line D-D shown in FIG. 8.
Figure 9:
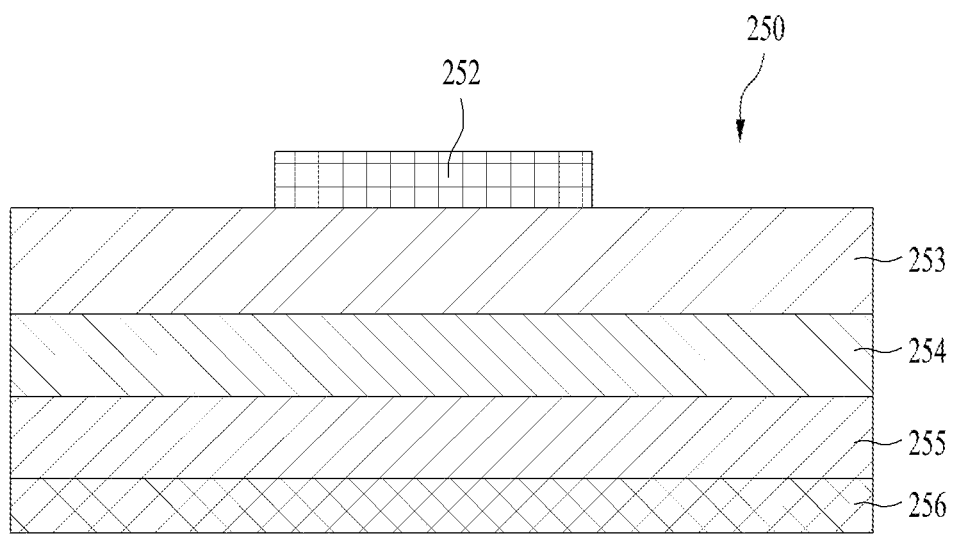
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 µm for example and the individual semiconductor light emitting element 250 may include a rectangular or square element. For example, the rectangular element may have a size equal to or smaller than 20 µm×80 µm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include an n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 290. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In the display device using the semiconductor light-emitting element of the present disclosure described above, the semiconductor light-emitting element grown on a wafer is placed on a wiring substrate in the flip-chip form and used as an individual pixel.

Figure 10A:
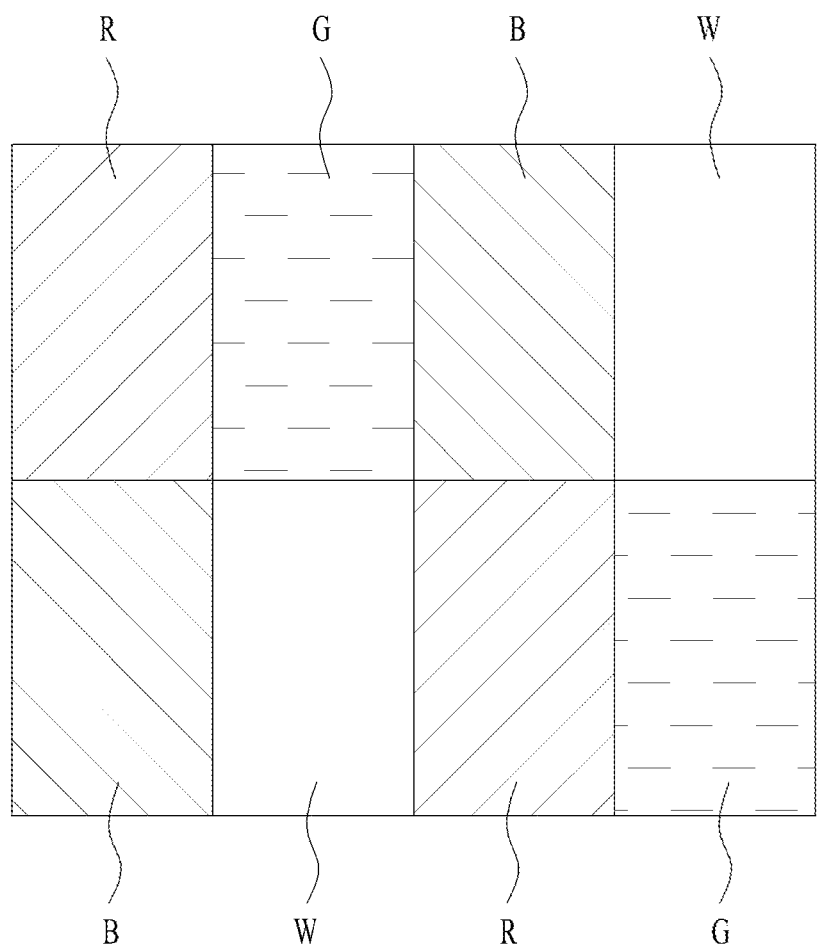
FIG. 10A is a schematic diagram showing the pixel structure of a display device using an organic light-emitting device.

FIG. 10A is a schematic diagram showing the pixel structure of a display device using an organic light-emitting device.

Referring to FIG. 10A, an example of the pixel structure of a display device using an organic light-emitting device is illustrated.

Here, as an example of the organic light-emitting device, there is an organic light-emitting diode (OLED). The following description will be made on the assumption that the organic light-emitting device is an organic light-emitting diode.

The OLED may include at least one organic layer disposed between and electrically connected to an anode and a cathode. When current is applied thereto, the anode injects holes and the cathode injects electrons into the organic layer.

The injected holes and electrons each migrate toward the oppositely charged electrode. When an electron and a hole localize on the same molecule, an "exciton," which is a localized electron-hole pair having an excited energy state, is formed. Light is emitted when the exciton relaxes via a photoemissive mechanism.

That is, the organic light-emitting diode (OLED) may include at least one of a hole injection layer, a hole transport layer, an electron blocking layer, an emission layer, a hole blocking layer, an electron transport layer, or an electron injection layer. Hereinafter, a detailed description of the structure of the OLED will be omitted.

Referring back to FIG. 10A, a unit pixel of the OLED may include red (R), green (G), and blue (B) subpixels, and may further include a white (W) subpixel. That is, in FIG. 10A, the unit pixel may be composed of four subpixels including red (R), green (G), blue (B), and white (W) subpixels. In FIG. 10A, the unit pixel may include four subpixels disposed in a horizontal direction, or may include four subpixels disposed in two rows.

Meanwhile, as is generally known in the art, OLED displays are very vulnerable to light, heat, or moisture due to the characteristics of the organic constituents contained in the material thereof, and thus have a problem in that an OLED emission layer is easily degraded. However, it is difficult to substantially alleviate this degradation phenomenon at present. Therefore, as described above, attempts are being made to improve brightness through structural improvement, for example, addition of white (W) subpixels.

Figure 10B:
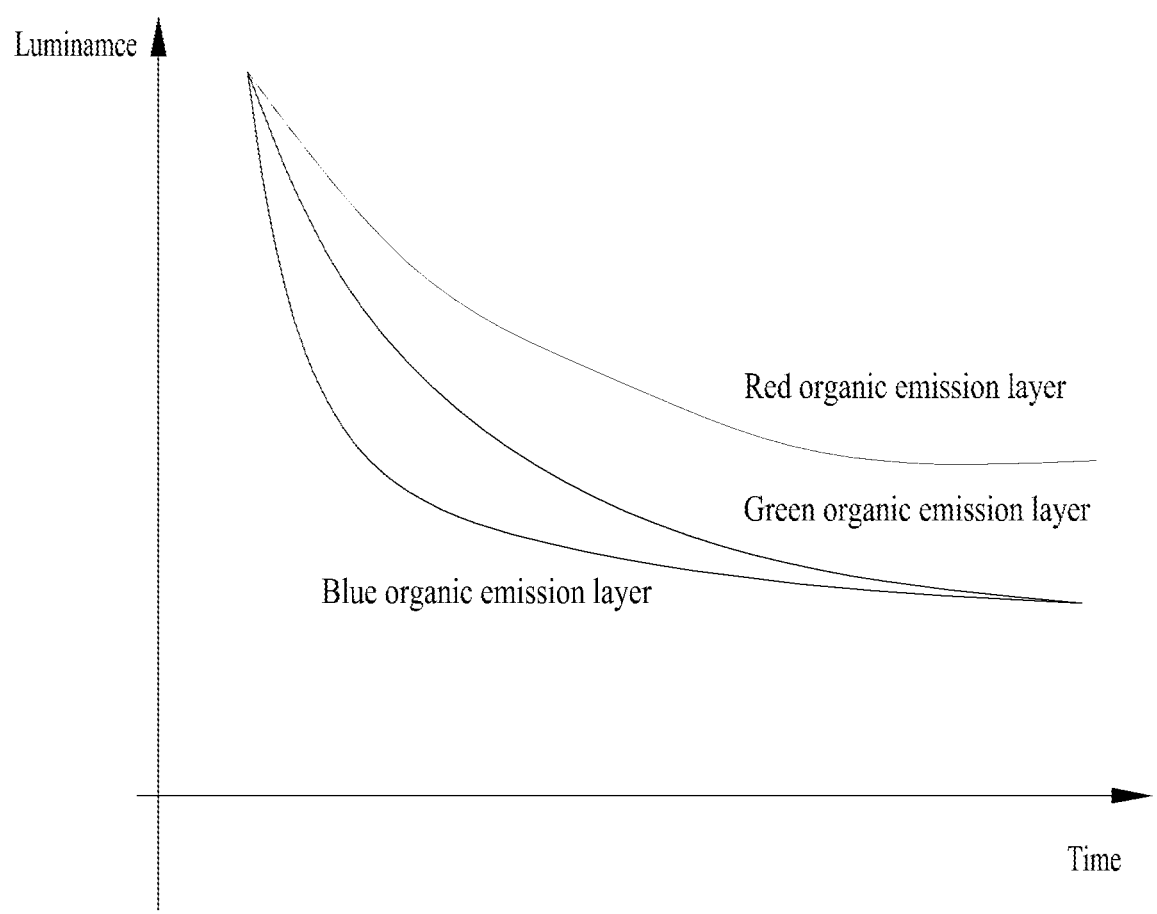
FIG. 10B is a graph showing the degradation characteristics of the pixel of the display device using an organic light-emitting device.

FIG. 10B is a graph showing the degradation characteristics of the pixel of the display device using an organic light-emitting device.

Referring to FIG. 10B, as described above, the OLED display is very vulnerable to light, heat, or moisture due to the characteristics of the organic constituents contained in the material thereof, which may lead to degradation in the luminance thereof.

In addition, the shorter the wavelength of the light emitted from the OLED, the greater the degradation in luminance. That is, a blue element (a blue organic emission layer) is degraded more over time.

Degradation of the blue element may entail a problem of occurrence of yellowing of the screen of the display. That is, the entire area of the screen of the display appears yellowish. This may be caused by a red-shift phenomenon, which results from reduction in the luminance of blue light due to degradation of the blue element.

Figure 11:
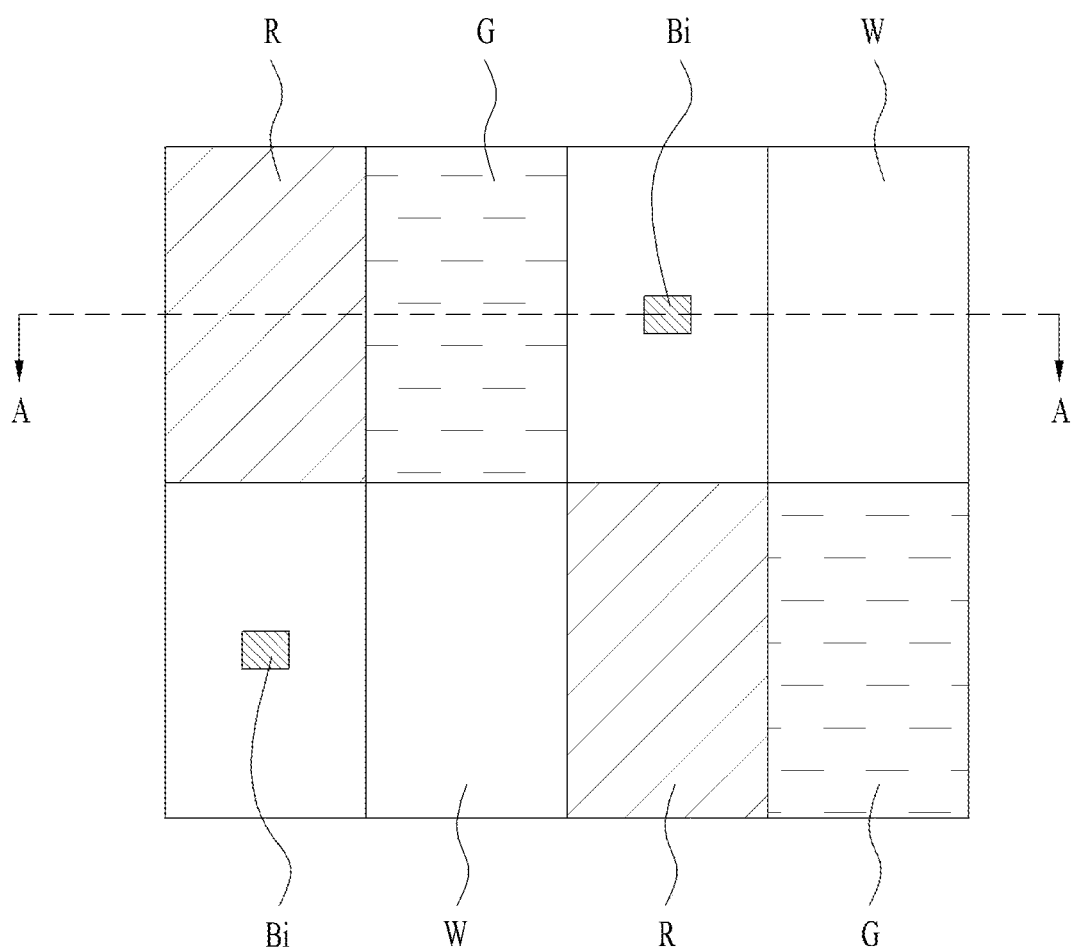
FIG. 11 is a schematic diagram showing the pixel structure of a display device using a light-emitting element according to a first embodiment of the present disclosure.

FIG. 11 is a schematic diagram showing the pixel structure of a display device using a light-emitting element according to a first embodiment of the present disclosure.

Referring to FIG. 11, a unit pixel of a display device according to a first embodiment of the present disclosure may include a first subpixel R, which emits light of a first color and includes an organic light-emitting diode (OLED), a second subpixel G, which emits light of a second color and includes an organic light-emitting diode (OLED), a third subpixel Bi, which emits light of a third color and includes an inorganic light-emitting diode (LED), and a fourth subpixel, which includes an organic light-emitting diode (OLED) emitting light in which light of the first color to light of the third color are mixed.

Each of these subpixels may be disposed between and may be electrically connected to a respective one of a plurality of segmented first electrodes 340 (refer to FIG. 12) and a second electrode 370 (refer to FIG. 12), which is a common electrode located above the first electrodes. This will be described in detail later.

As a specific example, the unit pixel of the display device according to the first embodiment of the present disclosure may include red (R), green (G), blue (Bi), and white (W) subpixels. In FIG. 11, the unit pixel may include four subpixels disposed in a horizontal direction, or may include four subpixels disposed in two rows.

In this case, each of the red (R), green (G), and white (W) subpixels may be implemented as an organic light-emitting diode (OLED), and the blue (Bi) subpixel may be implemented as an inorganic light-emitting device (an inorganic light-emitting diode (LED)) using, for example, a nitride-based semiconductor (e.g. GaN).

As described above, because a blue OLED (a blue organic emission layer) is degraded more over time, the unit pixel may be constituted such that a blue OLED is substituted with the inorganic light-emitting diode (LED).

Figure 12:
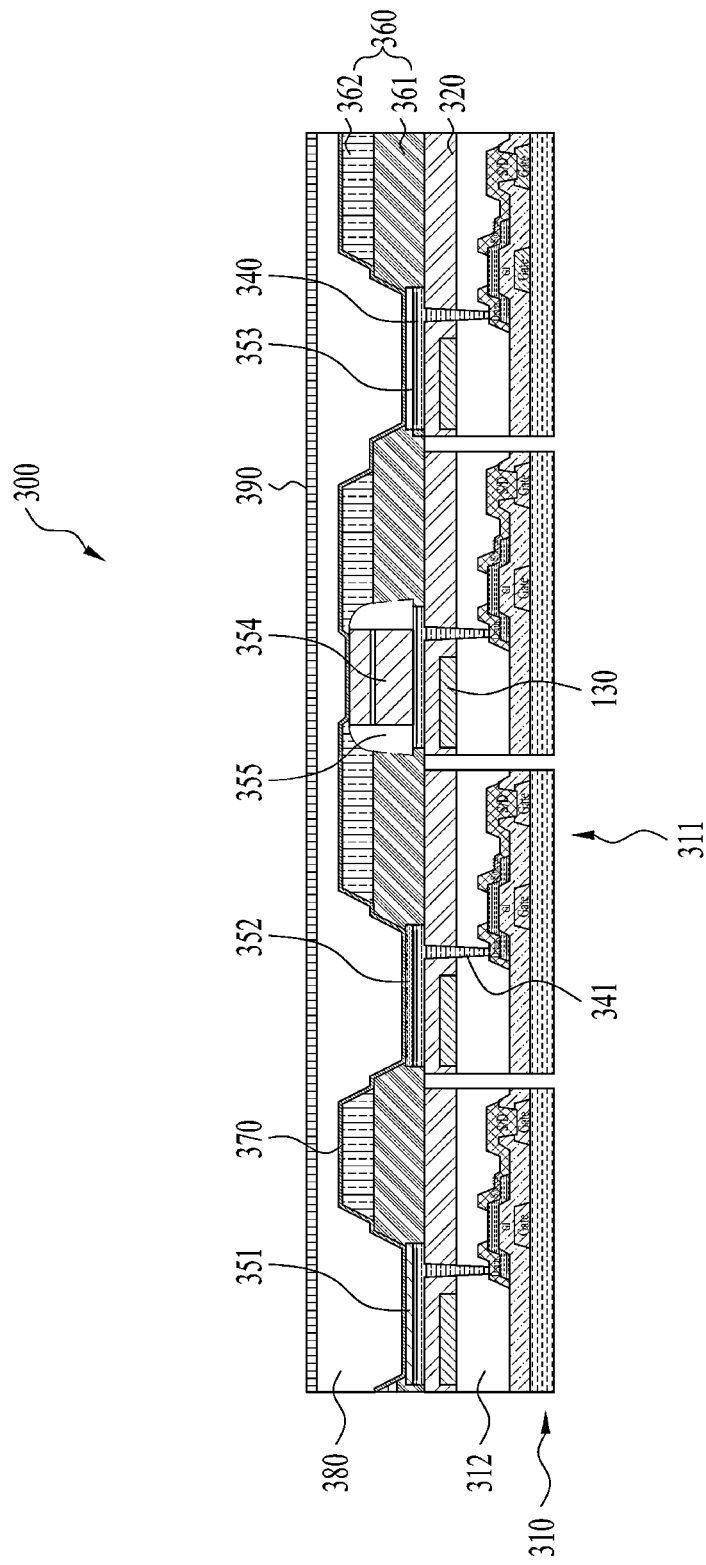
FIG. 12 is a cross-sectional view taken along line A-A in FIG. 11.

FIG. 12 is a cross-sectional view taken along line A-A in FIG. 11, which shows an example of the display device using a light-emitting element according to the first embodiment of the present disclosure.

Referring to FIG. 12, a display device 300 having an active matrix (AM) structure is illustrated. However, the present disclosure is not limited to the AM structure, and may also be applied to a display device having a passive matrix (PM) structure.

As described above with reference to FIG. 11, the display device 300 using a light-emitting element according to the first embodiment of the present disclosure may include a plurality of segmented first electrodes 340, a second electrode 370, which is a common electrode located above the first electrodes 340, and a plurality of subpixels 351, 352, 353, and 354, each of which is disposed between and is electrically connected to a respective one of the first electrodes 340 and the second electrode 370 to constitute an individual pixel.

These subpixels may include a first subpixel 351, which emits light of a first color and includes an organic light-emitting diode (OLED), a second subpixel 352, which emits light of a second color and includes an organic light-emitting diode (OLED), a third subpixel 354, which emits light of a third color and includes an inorganic light-emitting diode (LED), and a fourth subpixel 353, which includes an organic light-emitting diode (OLED) emitting light in which light of the first color to light of the third color are mixed. Here, each subpixel and the corresponding organic light-emitting diode (OLED) or inorganic light-emitting diode (LED) may be conceptually the same. Accordingly, these components will be denoted by the same reference numerals in the following description.

Here, each of the first electrodes 340 may be an anode. Each of the first electrodes 340 may be connected to a drain electrode Drain of a thin-film transistor 311, which serves as a switching transistor, via a via electrode 341.

A thin-film transistor substrate 310 may include an individual thin-film transistor 311. The thin-film transistor 311 may include a gate electrode Gate located on a substrate 313, a gate insulator GI located on the gate electrode Gate, and a drain electrode Drain and a source electrode Source located on the gate insulator GI. Hereinafter, a detailed description of the thin-film transistor substrate 310 will be omitted.

An insulating layer 312 may be located on the thin-film transistor substrate 310, and a first planarization layer 320 may be located on the insulating layer.

The anode 340 may be disposed on the first planarization layer 320 so as to be connected to the individual thin-film transistor 311. As mentioned above, the individual thin-film transistor 311 and the anode 340 may be connected to each other via the via electrode 341, which penetrates the insulating layer 312 and the first planarization layer 320.

FIG. 12 shows four subpixels constituting one individual pixel described above. That is, each of the first subpixel 351 emitting light of a first color, the second subpixel 352 emitting light of a second color, the third subpixel 354 emitting light of a third color, and the fourth subpixel 353 emitting light in which light of the first color to light of the third color are mixed may be located on a respective one of the anodes 340.

Here, the first color may be red (R), the second color may be green (G), the third color may be blue (Bi), and the fourth color may be white (W).

Meanwhile, a conductive adhesive layer 355 may be located on at least one side surface of the inorganic light-emitting diode (LED) 354. That is, the LED 354 may be attached to the anode 340 via the conductive adhesive layer 355 so as to be electrically connected thereto. Here, the conductive adhesive layer 355 is as described above. That is, the conductive adhesive layer may be a resin layer including a conductive ball, and this resin layer may be a resin layer cured by application of heat or light.

In this case, the conductive adhesive layer 355 may have a specific color. In one example, the conductive adhesive layer 355 may be white or black. In an alternative example, the conductive adhesive layer 355 may include a dye of any one of the first color to the third color.

Meanwhile, a color correction layer 130 may be located on the planarization layer 320 corresponding to each of the subpixels 351, 352, 353, and 354. The color correction layer 130 may correct the color of each subpixel.

As shown in FIG. 12, the inorganic light-emitting diode (LED) constituting the third subpixel 354 may be thicker than the organic light-emitting diodes (OLEDs) constituting the remaining subpixels 351, 352, and 353. Accordingly, a height compensation layer 360 for compensating for a height difference between the inorganic light-emitting diode (LED) and the organic light-emitting diodes (OLEDs) may be provided on the first planarization layer 320.

In one example, when the height difference between the inorganic light-emitting diode (LED) and the organic light-emitting diodes (OLEDs) is large, the height compensation layer 360 may be composed of two or more layers. FIG. 12 shows an example in which the height compensation layer 360 includes a first height compensation layer 361 and a second height compensation layer 362 located on the first height compensation layer 361.

The height of the inorganic light-emitting diode (LED) may be about four times to ten times greater than the height of the organic light-emitting diodes (OLEDs). In this case, it may be preferable to form the height compensation layer 360 multiple times.

The second electrode 370 may be located on the height compensation layer 360. In addition, the second electrode 370 may be connected to all of the subpixels 351, 352, 353, and 354. That is, the second electrode 370 may be a common electrode. In this case, the LED 354 constituting the third subpixel may be a vertical LED. That is, the LED 354 may be a vertical LED in which electrodes are respectively located on the lower side and the upper side, which are opposite each other.

The height of the height compensation layer 360 may be at least equal to the height of the inorganic light-emitting diode (LED) 354.

A second planarization layer 380 may be located on the second electrode 370. As described above, since there is a height difference between the inorganic light-emitting diode (LED) and the organic light-emitting diodes (OLEDs), the second electrode 370, which continuously interconnects the inorganic light-emitting diode (LED) and the organic light-emitting diodes (OLEDs), may be uneven due to the height difference. Therefore, the second planarization layer 380 may be provided in order to planarize the uneven surface of the second electrode attributable to the height difference.

A light-polarizing layer 390 may be located on the second planarization layer 380.

Figure 13:
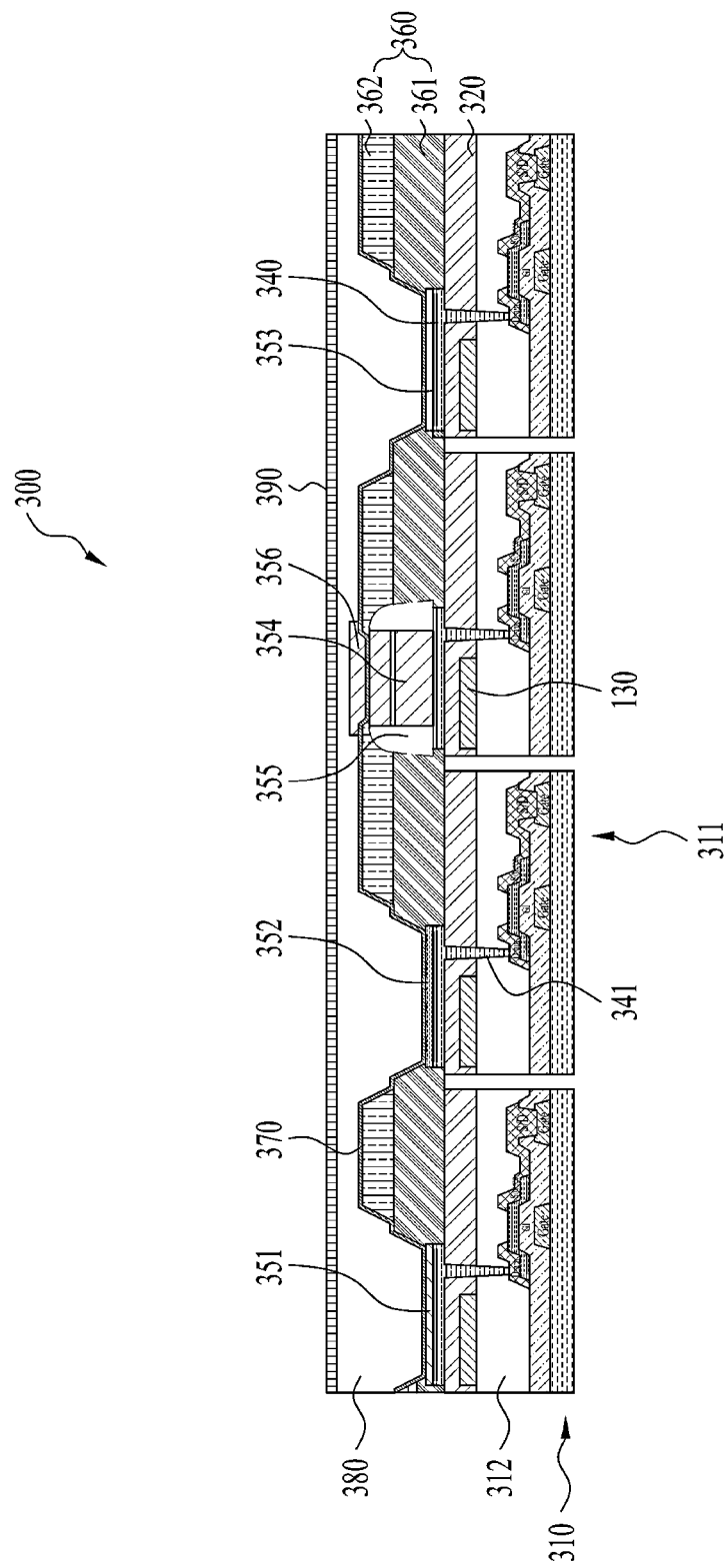
FIG. 13 is a cross-sectional view showing a display device using a light-emitting element according to a second embodiment of the present disclosure.

FIG. 13 is a cross-sectional view showing a display device using a light-emitting element according to a second embodiment of the present disclosure.

Referring to FIG. 13, a display device 300 having an active matrix (AM) structure is illustrated. However, the present disclosure is not limited to the AM structure, and may also be applied to a display device having a passive matrix (PM) structure.

The display device 300 using a light-emitting element according to a second embodiment of the present disclosure may include a plurality of segmented first electrodes 340, a second electrode 370, which is a common electrode located above the first electrodes 340, and a plurality of subpixels 351, 352, 353, and 354, each of which is disposed between and is electrically connected to a respective one of the first electrodes 340 and the second electrode 370 to constitute an individual pixel.

FIG. 13 shows four subpixels constituting one individual pixel described above. That is, each of the first subpixel 351 emitting light of a first color, the second subpixel 352 emitting light of a second color, the third subpixel 354 emitting light of a third color, and the fourth subpixel 353 emitting light in which light of the first color to light of the third color are mixed may be located on a respective one of the anodes 340.

Here, the first color may be red (R), the second color may be green (G), the third color may be blue (Bi), and the fourth color may be white (W).

In this case, a quantum dot 356 may be located on the third subpixel 354 emitting blue light, i.e. the blue LED. The quantum dot 356 may be provided for uniformity of the wavelength of light. In addition, the blue LED 354 and the blue quantum dot 356 may be used together for color correction.

The quantum dot 356 emitting blue light may be located on the second electrode 370 at a position corresponding to the blue LED 354. The quantum dot 356 may correct the color of light from the blue LED so that the color of light from the blue LED becomes the same as that from the OLED when the LED 354 is used in the organic light-emitting diode display.

Other parts not described herein may be the same as those described above with reference to FIG. 12. Therefore, duplicate descriptions thereof will be omitted.

Figure 14:
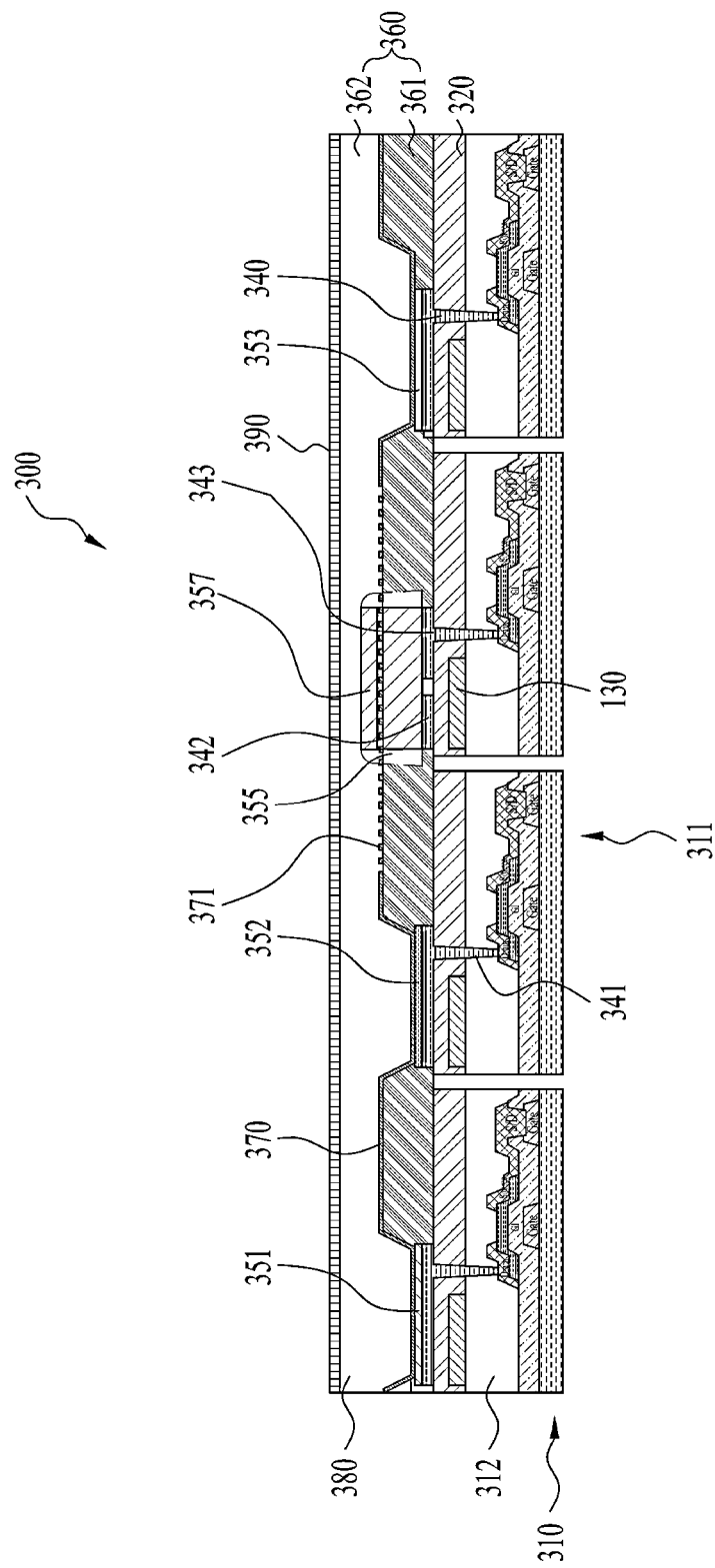
FIG. 14 is a cross-sectional view showing a display device using a light-emitting element according to a third embodiment of the present disclosure.

FIG. 14 is a cross-sectional view showing a display device using a light-emitting element according to a third embodiment of the present disclosure.

Referring to FIG. 14, a display device 300 having an active matrix (AM) structure is illustrated. However, the present disclosure is not limited to the AM structure, and may also be applied to a display device having a passive matrix (PM) structure.

The display device 300 using a light-emitting element according to a third embodiment of the present disclosure may include a plurality of segmented first electrodes 340, a second electrode 370, which is a common electrode located above the first electrodes 340, and a plurality of subpixels 351, 352, 353, and 357, each of which is disposed between and is electrically connected to a respective one of the first electrodes 340 and the second electrode 370 to constitute an individual pixel.

FIG. 14 shows four subpixels constituting one individual pixel described above. That is, each of the first subpixel 351 emitting light of a first color, the second subpixel 352 emitting light of a second color, the third subpixel 357 emitting light of a third color, and the fourth subpixel 353 emitting light in which light of the first color to light of the third color are mixed may be located on a respective one of the anodes 340.

Here, the first color may be red (R), the second color may be green (G), the third color may be blue (Bi), and the fourth color may be white (W).

In this case, the third subpixel 357 emitting blue light may be formed in a manner such that a blue horizontal LED is provided in a flip-chip bonding scheme.

That is, the orientation of the horizontal LED may be reversed such that the two electrodes thereof are located at the lower side thereof. The LED may be connected to the second electrode 370 through a different path in a manner such that one electrode thereof is connected to an anode 343 and the remaining electrode thereof is connected to a separate cathode 342.

In this case, as shown in FIG. 14, the inorganic light-emitting diode (LED) constituting the third subpixel 357 may be 340 than the organic light-emitting diodes (OLEDs) constituting the remaining subpixels 351, 352, and 353. Accordingly, a height compensation layer 360 for compensating for the height difference between the inorganic light-emitting diode (LED) and the organic light-emitting diodes (OLEDs) may be provided on a first planarization layer 320.

However, the thickness of the horizontal LED 357 may be less than that of the vertical LED 354. Accordingly, it may be preferable to compensate for the height difference between the inorganic light-emitting diode (LED) and the organic light-emitting diodes (OLEDs) using a single height compensation layer 360.

Meanwhile, because the upper side of the horizontal LED 357 does not need to be connected to the second electrode 370, an open portion 371 may be formed in the second electrode 370 so as to be open at a position at which the horizontal LED 357 is located.

Accordingly, in this case, it is not necessary to form the height compensation layer 360 to the same thickness as the horizontal LED 357, and thus the height of the height compensation layer 360 may be reduced.

Other parts not described herein may be the same as those described above with reference to FIG. 12. Therefore, duplicate descriptions thereof will be omitted.

Figure 15:
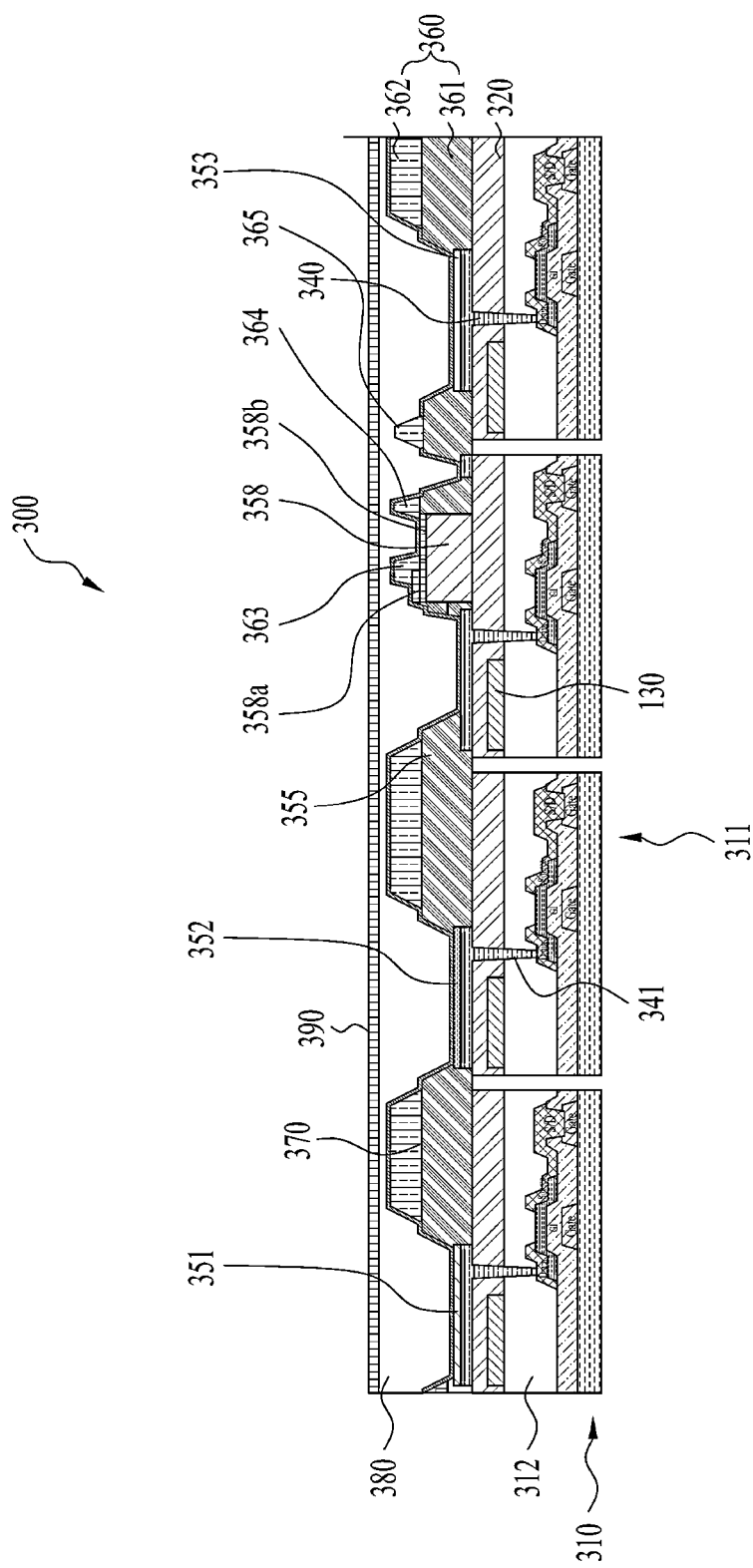
FIG. 15 is a cross-sectional view showing a display device using a light-emitting element according to a fourth embodiment of the present disclosure.

FIG. 15 is a cross-sectional view showing a display device using a light-emitting element according to a fourth embodiment of the present disclosure.

Referring to FIG. 15, a display device 300 having an active matrix (AM) structure is illustrated. However, the present disclosure is not limited to the AM structure, and may also be applied to a display device having a passive matrix (PM) structure.

The display device 300 using a light-emitting element according to a fourth embodiment of the present disclosure may include a plurality of segmented first electrodes 340, a second electrode 370, which is a common electrode located above the first electrodes 340, and a plurality of subpixels 351, 352, 353, and 358, each of which is disposed between and is electrically connected to a respective one of the first electrodes 340 and the second electrode 370 to constitute an individual pixel.

FIG. 15 shows four subpixels constituting one individual pixel described above. That is, each of the first subpixel 351 emitting light of a first color, the second subpixel 352 emitting light of a second color, the third subpixel 358 emitting light of a third color, and the fourth subpixel 353 emitting light in which light of the first color to light of the third color are mixed may be located on a respective one of the anodes 340.

Here, the first color may be red (R), the second color may be green (G), the third color may be blue (Bi), and the fourth color may be white (W).

In this case, the third subpixel 358 emitting blue light may be formed in a manner such that a blue horizontal LED is provided in a normal bonding scheme.

That is, the orientation of the horizontal LED is maintained in a normal state such that the horizontal LED is located at one side of the anode 340. The LED may be connected to the second electrode 370 through a different path in a manner such that one electrode 358a thereof is connected to an anode 343 and the remaining electrode 358b thereof is connected to a separate cathode 342.

In this way, in the case in which the horizontal LED 358 is provided in a normal bonding scheme, insulating structures 363, 364, and 365 for electrically isolating the two electrodes 358a and 358b of the LED 358 may be further provided.

In this case, as shown in FIG. 15, the inorganic light-emitting diode (LED) constituting the third subpixel 358 may be thicker than the organic light-emitting diodes (OLEDs) constituting the remaining subpixels 351, 352, and 353. Accordingly, a height compensation layer 360 for compensating for the height difference between the inorganic light-emitting diode (LED) and the organic light-emitting diodes (OLEDs) may be provided on a first planarization layer 320.

Other parts not described herein may be the same as those described above with reference to FIG. 12. Therefore, duplicate descriptions thereof will be omitted.

Figure 16:
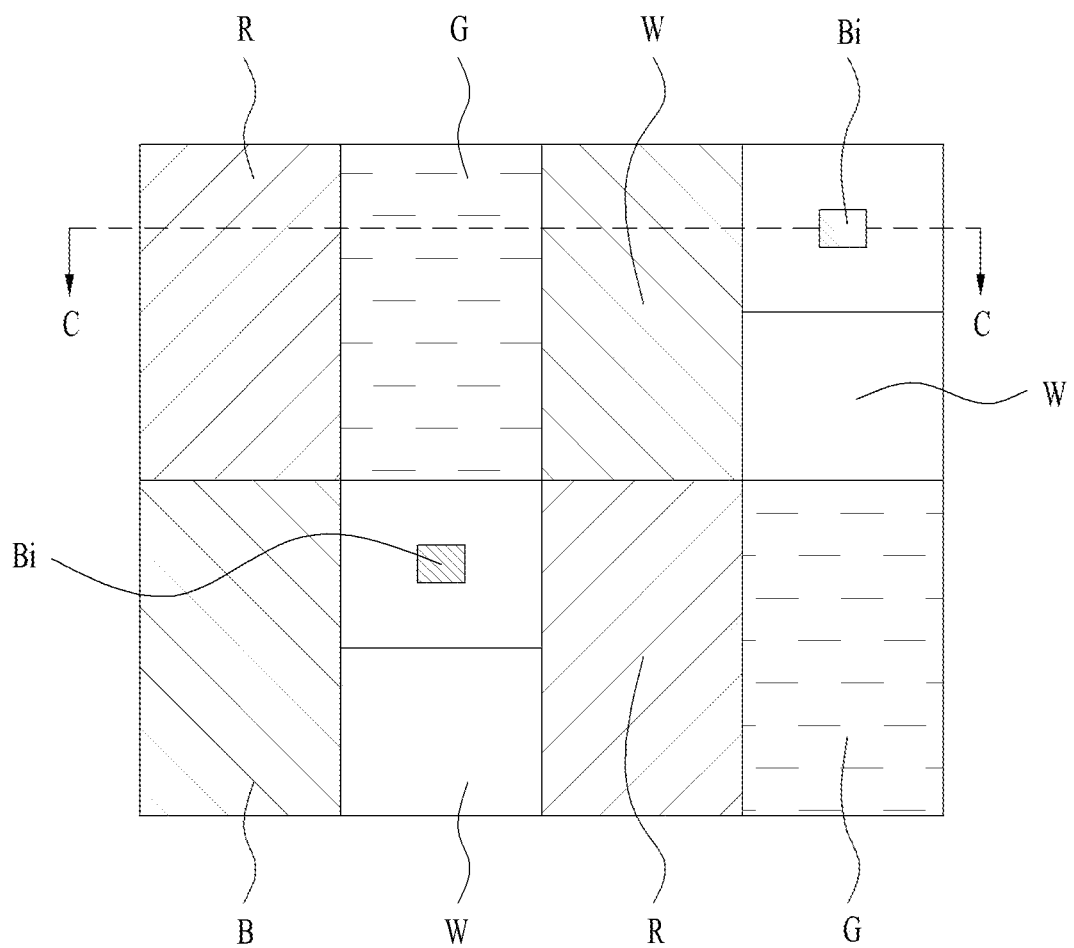
FIG. 16 is a schematic diagram showing the pixel structure of a display device using a light-emitting element according to a fifth embodiment of the present disclosure.

FIG. 16 is a schematic diagram showing the pixel structure of a display device using a light-emitting element according to a fifth embodiment of the present disclosure.

A unit pixel of a display device according to a fifth embodiment of the present disclosure may include a first subpixel R, which emits light of a first color and includes an organic light-emitting diode (OLED), a second subpixel G, which emits light of a second color and includes an organic light-emitting diode (OLED), a third subpixel Bi, which emits light of a third color and includes an inorganic light-emitting diode (LED), and a fourth subpixel, which includes an organic light-emitting diode (OLED) emitting light in which light of the first color to light of the third color are mixed.

In addition, a fifth subpixel Bo, which emits light of the third color and includes an organic light-emitting diode, may be further included. That is, light of the third color may be emitted from two subpixels, and the two subpixels may complement each other in order to stably emit light of the third color.

Each of these subpixels may be disposed between and may be electrically connected to a respective one of a plurality of segmented first electrodes 340 (refer to FIG. 17) and a second electrode 370 (refer to FIG. 17), which is a common electrode located above the first electrodes. This will be described in detail later.

As a specific example, the unit pixel of the display device according to the fifth embodiment of the present disclosure may include red (R), green (G), blue (Bi and Bo), and white (W) subpixels. In FIG. 16, the unit pixel may include five subpixels disposed in a horizontal direction, or may include five subpixels disposed in two rows.

In this case, each of the red (R), green (G), blue (Bo), and white (W) subpixels may be implemented as an organic light-emitting diode (OLED), and the other blue (Bi) subpixel may be implemented as an inorganic light-emitting device (an inorganic light-emitting diode (LED)) using, for example, a nitride-based semiconductor (e.g. GaN).

As described above, because the blue OLED (the blue organic emission layer) is degraded more over time, the unit pixel may be constituted such that the blue OLED is supplemented using the inorganic light-emitting diode (LED).

In this case, as illustrated, the size of each of the third subpixel Bi and the fourth subpixel W may be smaller than the size of the first subpixel R or the second subpixel G. In this case, for example, the size of each of the third subpixel Bi and the fourth subpixel W may be half the size of the first subpixel R or the second subpixel G.

The reason for this is that the size of an LED may be smaller than that of an OLED. Accordingly, the fourth subpixel W may be located at one side of the third subpixel Bi, which is implemented as an LED.

Figure 17:
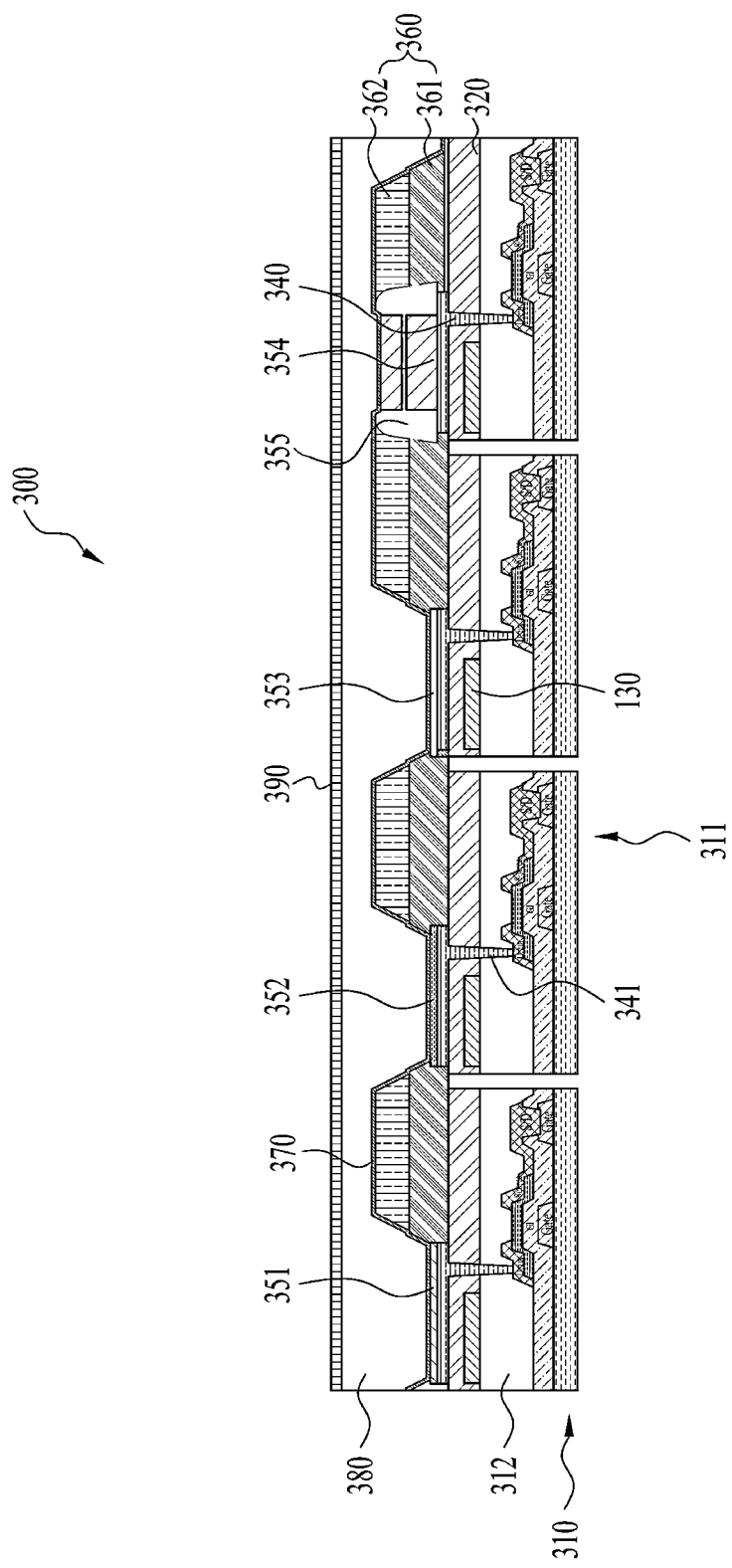
FIG. 17 is a cross-sectional view taken along line C-C in FIG. 16.

FIG. 17 is a cross-sectional view taken along line C-C in FIG. 16, which shows the display device using a light-emitting element according to the fifth embodiment of the present disclosure.

Referring to FIG. 17, a unit pixel of the display device according to the fifth embodiment of the present disclosure may include a first subpixel 351, which emits light of a first color and includes an organic light-emitting diode (OLED), a second subpixel 352, which emits light of a second color and includes an organic light-emitting diode (OLED), a third subpixel 354, which emits light of a third color and includes an inorganic light-emitting diode (LED), and a fifth subpixel 356, which emits light of the third color and includes an organic light-emitting diode.

As described above with reference to FIG. 16, the fifth subpixel 356 may be located between the second subpixel 352 and the third subpixel 354.

In this case, the position of the fourth subpixel is not shown in FIG. 16. In the cross-sectional view, the fourth subpixel is not visible because the third subpixel 354 overlaps the same.

As described above, the third subpixel 354, which includes an inorganic light-emitting diode (LED), and the fifth subpixel 356, which emits light of the third color and includes an organic light-emitting diode, may complement each other in order to stably emit light of the third color (blue light).

Each of these subpixels may be disposed between and may be electrically connected to a respective one of a plurality of segmented first electrodes 340 and a second electrode 370, which is a common electrode located above the first electrodes.

Other parts not described herein may be the same as those described above with reference to FIG. 12. Therefore, duplicate descriptions thereof will be omitted.

Figure 18:
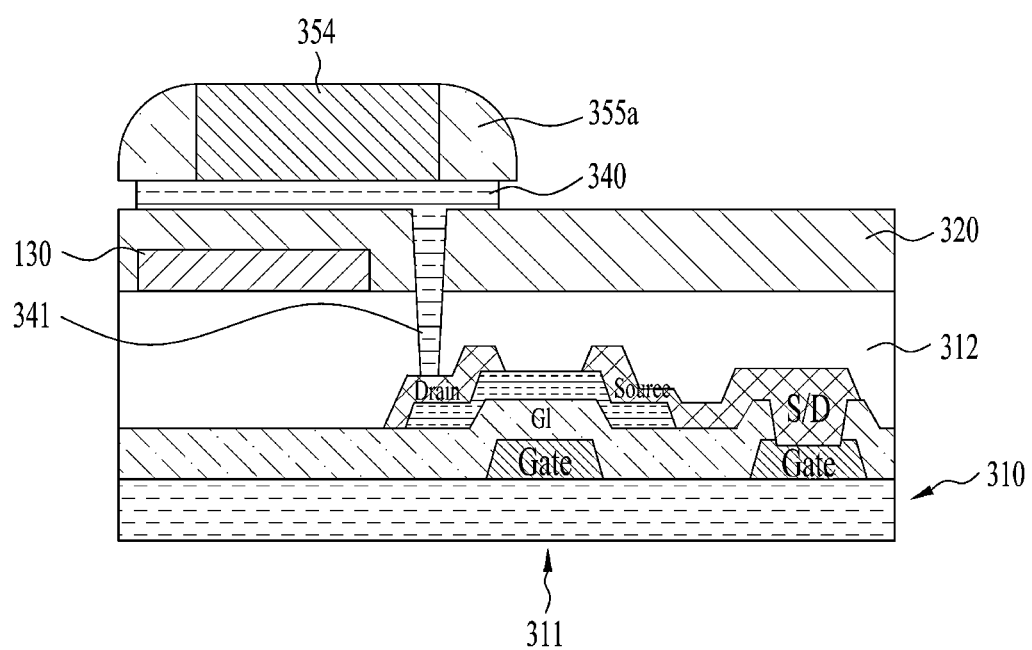
FIGS. 18 to 20 are diagrams showing examples of embodying the color characteristics of the display by implementing a color using a conductive adhesive layer.
Figure 19:
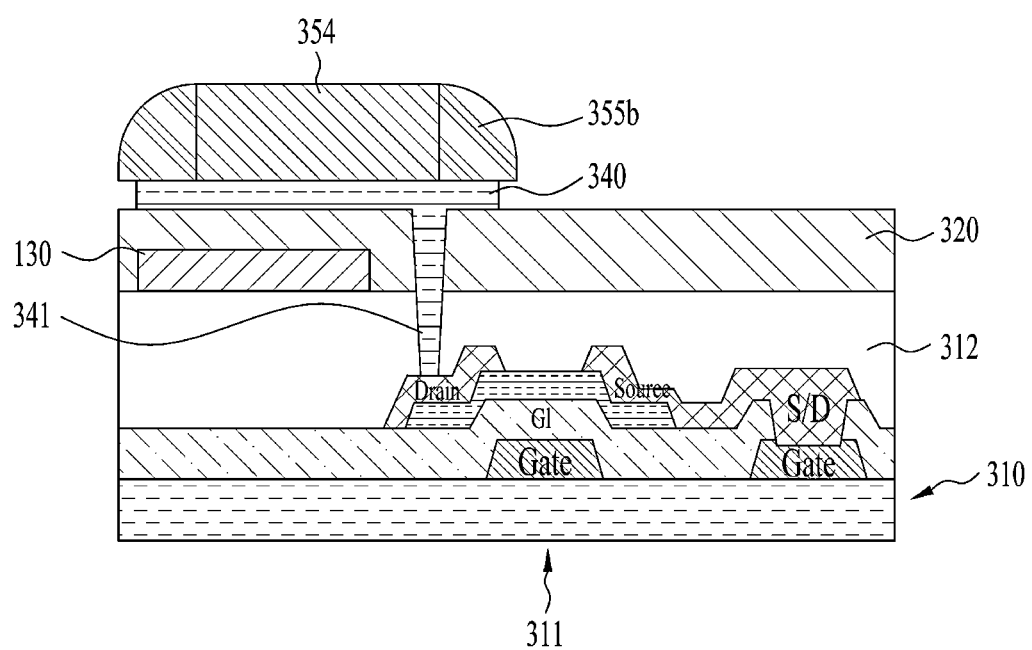
Figure 20:
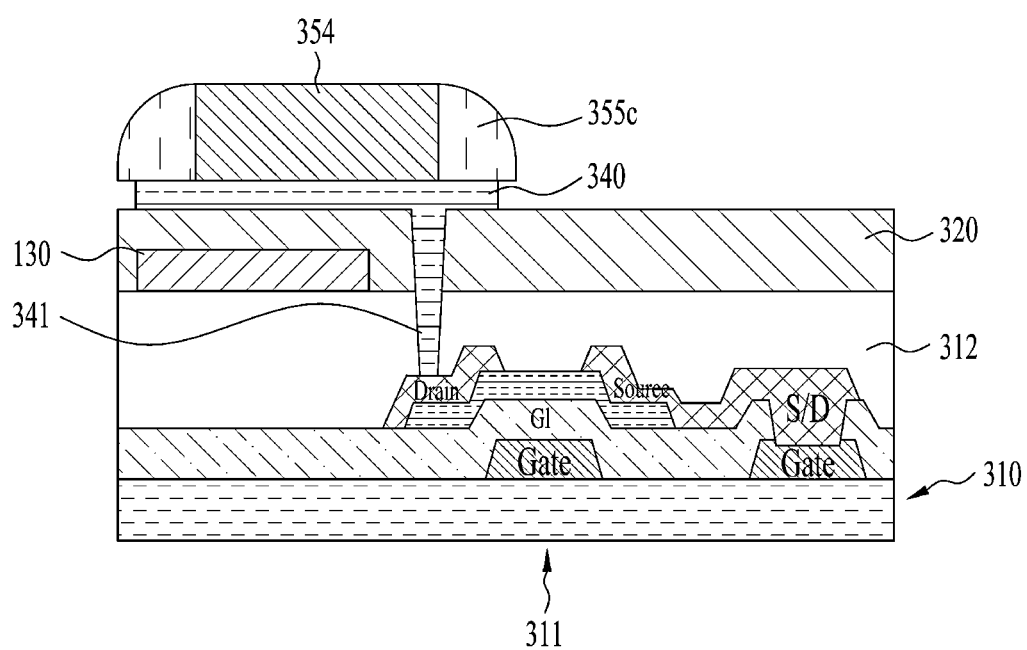

FIGS. 18 to 20 are diagrams showing examples of embodying the color characteristics of the display by implementing a color using a conductive adhesive layer.

As described above, the conductive adhesive layer 355 may be located on at least one side surface of the inorganic light-emitting diode (LED) 354. That is, the LED 354 may be attached to the anode 340 via the conductive adhesive layer 355 so as to be electrically connected thereto.

In this case, the conductive adhesive layer 355 may have a specific color.

Referring to FIG. 18, the conductive adhesive layer 355 may include a dye of any one of the first to third colors. That is, a dye having any one of red, green, and blue colors may be included.

The conductive adhesive layer 355 including the dye may embody specific characteristics of the display. For example, when a specific color component is required in order to implement the display, the conductive adhesive layer 355 may be implemented to include a dye of the corresponding color.

Alternatively, as shown in FIG. 19, the conductive adhesive layer 355 may be white, or may include a white dye. The white conductive adhesive layer 355 may block optical interference. In addition, the white conductive adhesive layer 355 may serve to improve the luminance of the display.

Meanwhile, as shown in FIG. 20, the conductive adhesive layer 355 may be black, or may include a black dye. The black conductive adhesive layer 355 may block optical interference. In addition, the black conductive adhesive layer 355 may serve to improve a contrast ratio.

FIGS. 21 to 28 are cross-sectional views showing a method of manufacturing the display device using a light-emitting element according to the first embodiment of the present disclosure.

Hereinafter, a method of manufacturing the display device using a light-emitting element according to the first embodiment of the present disclosure will be described stepwise with reference to FIGS. 21 to 28.

Figure 21:
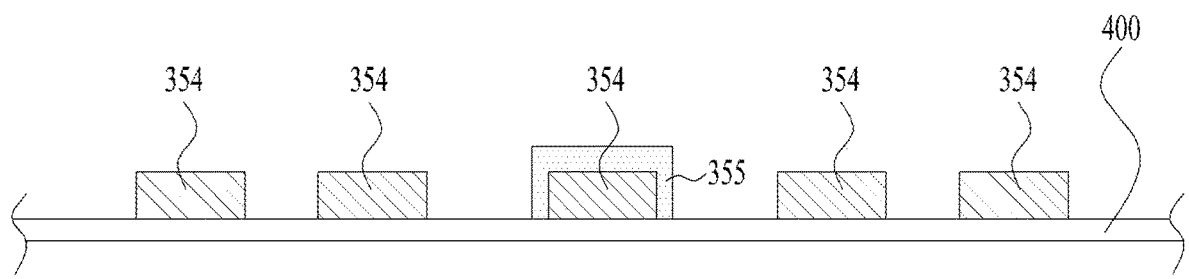
FIGS. 21 to 28 are cross-sectional views showing a method of manufacturing the display device using a light-emitting element according to the first embodiment of the present disclosure.

First, referring to FIG. 21, a plurality of LEDs 354 may be manufactured on a substrate 400. In this case, the substrate 400 may be a sapphire substrate, and the LEDs 354 may be gallium nitride (GaN)-based blue LEDs. A detailed description of the process of forming the LEDs 354 will be omitted.

Thereafter, the conductive adhesive layer 355 described above is formed on a target LED 354, which is to be attached (transferred) to the display device, among the plurality of LEDs 354.

Figure 22:
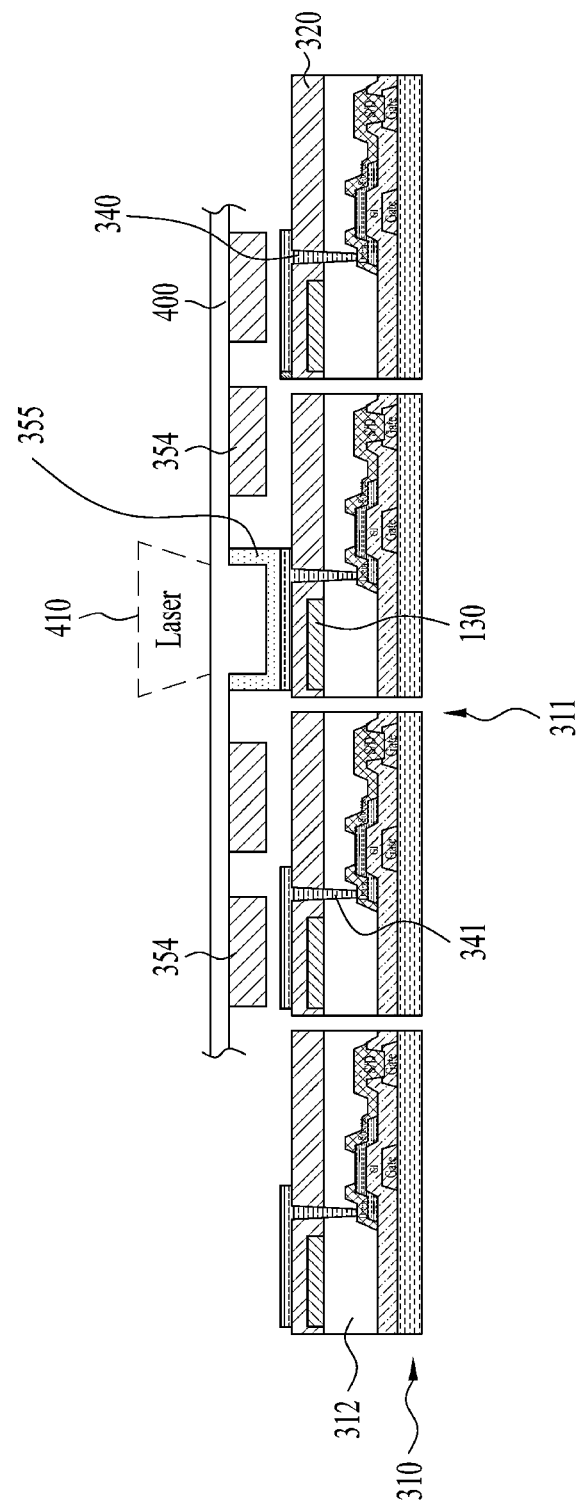

Subsequently, referring to FIG. 22, the LEDs 354 manufactured on the substrate 400 formed as described above are placed above a prepared thin-film transistor substrate 310. In this case, the LED 354 having the conductive adhesive layer 355 formed thereon is placed above an anode 340, at which a blue subpixel is to be located.

Thereafter, the substrate 400 is pressed onto the thin-film transistor substrate 310, and accordingly, a conductive ball in the conductive adhesive layer 355 electrically interconnects the LED 354 and the anode 340.

In addition, heat or light is applied to the conductive adhesive layer 355 so that the conductive adhesive layer 355 is cured, and accordingly, the LED 354 may be firmly attached to the anode 340.

Figure 23:
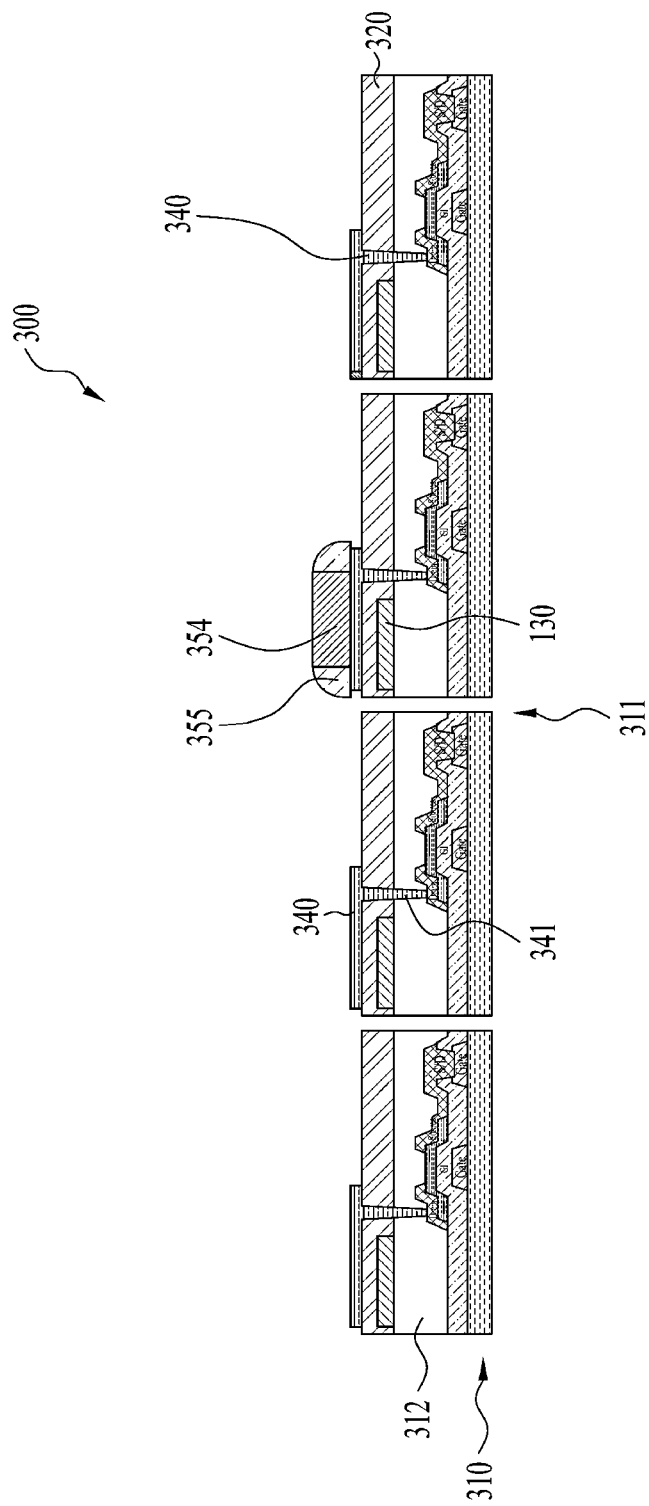

Thereafter, a laser 410 is applied to the corresponding LED 354 to remove the substrate 400 therefrom, thereby realizing the state shown in FIG. 23.

Figure 24:
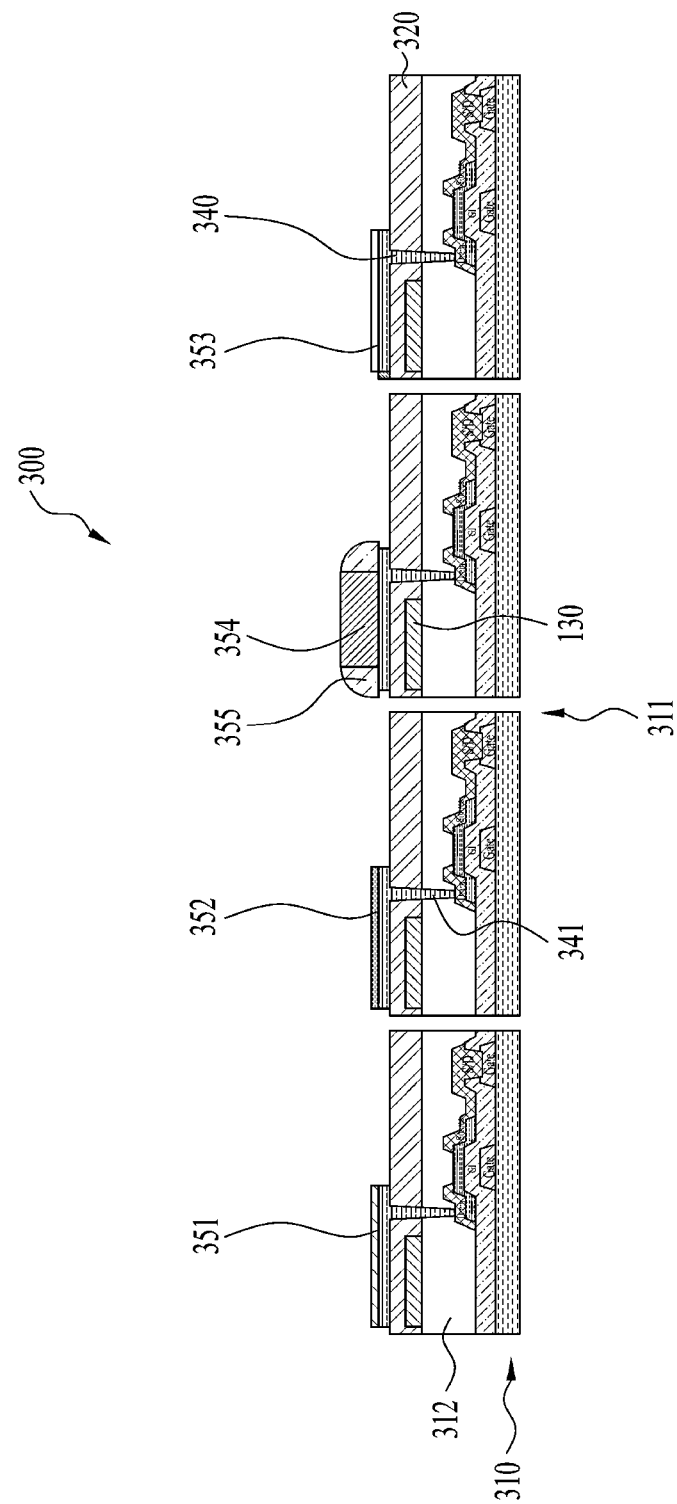

Referring to FIG. 24, OLED subpixels are formed on the remaining anodes 340. That is, a red OLED layer 351, a green OLED layer 352, and a white OLED layer 353 are formed.

Figure 25:
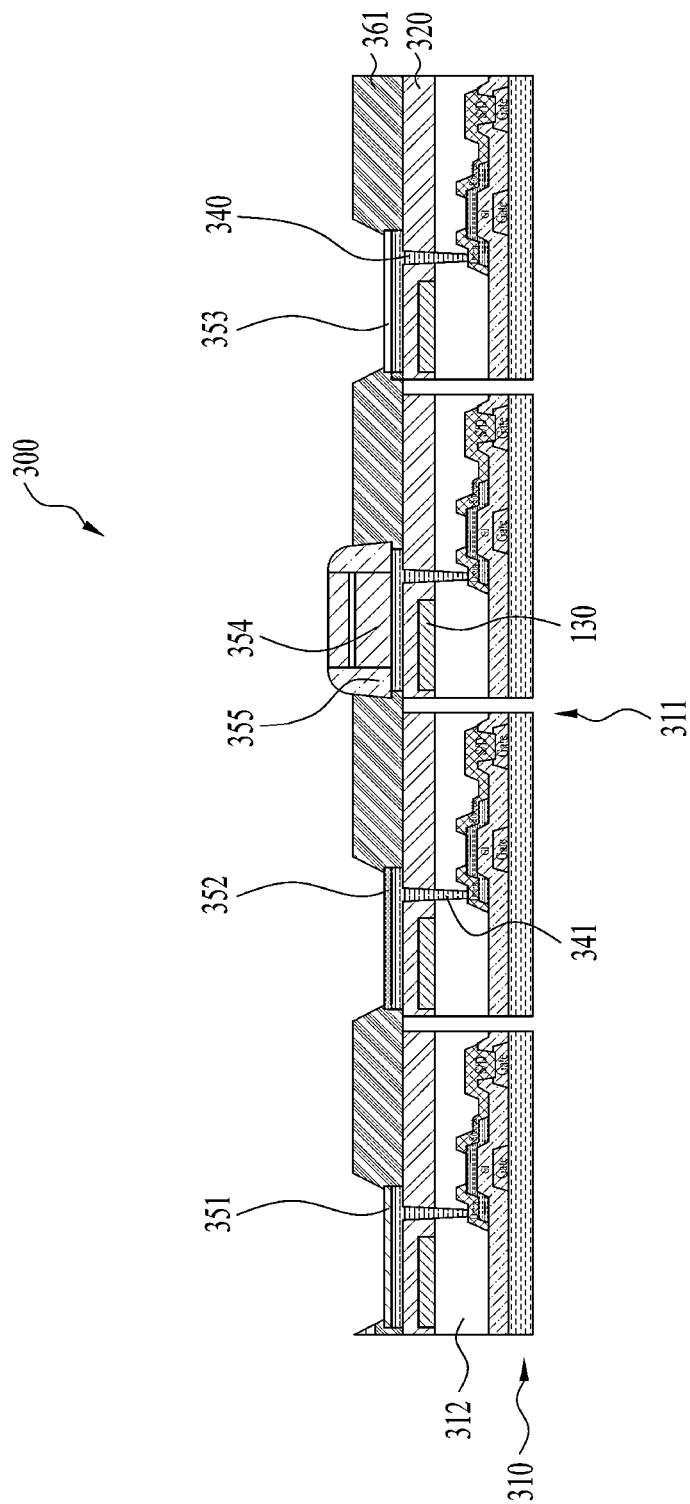

Thereafter, referring to FIG. 25, a first height compensation layer 361 is primarily formed to a height that makes it possible to cover the OLED subpixels 351, 352, and 353. That is, the height of the first height compensation layer 361 may be at least as high as the height that makes it possible to cover the OLED subpixels 351, 352, and 353.

Figure 26:
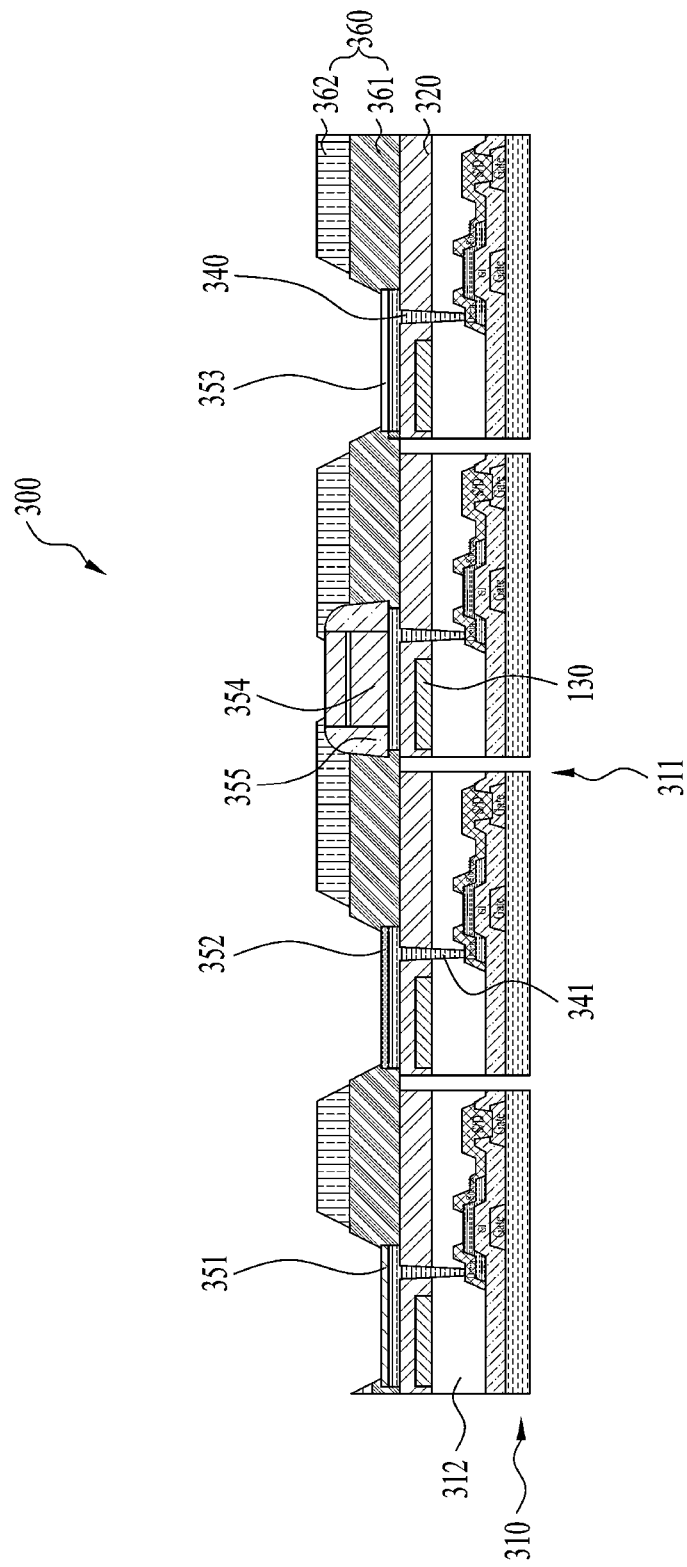

Subsequently, referring to FIG. 26, a second height compensation layer 362 is formed to a height that makes it possible to cover the LED 354. That is, the height of the second height compensation layer 362 may be at least as high as the height that makes it possible to cover the LED subpixel 354.

Figure 27:
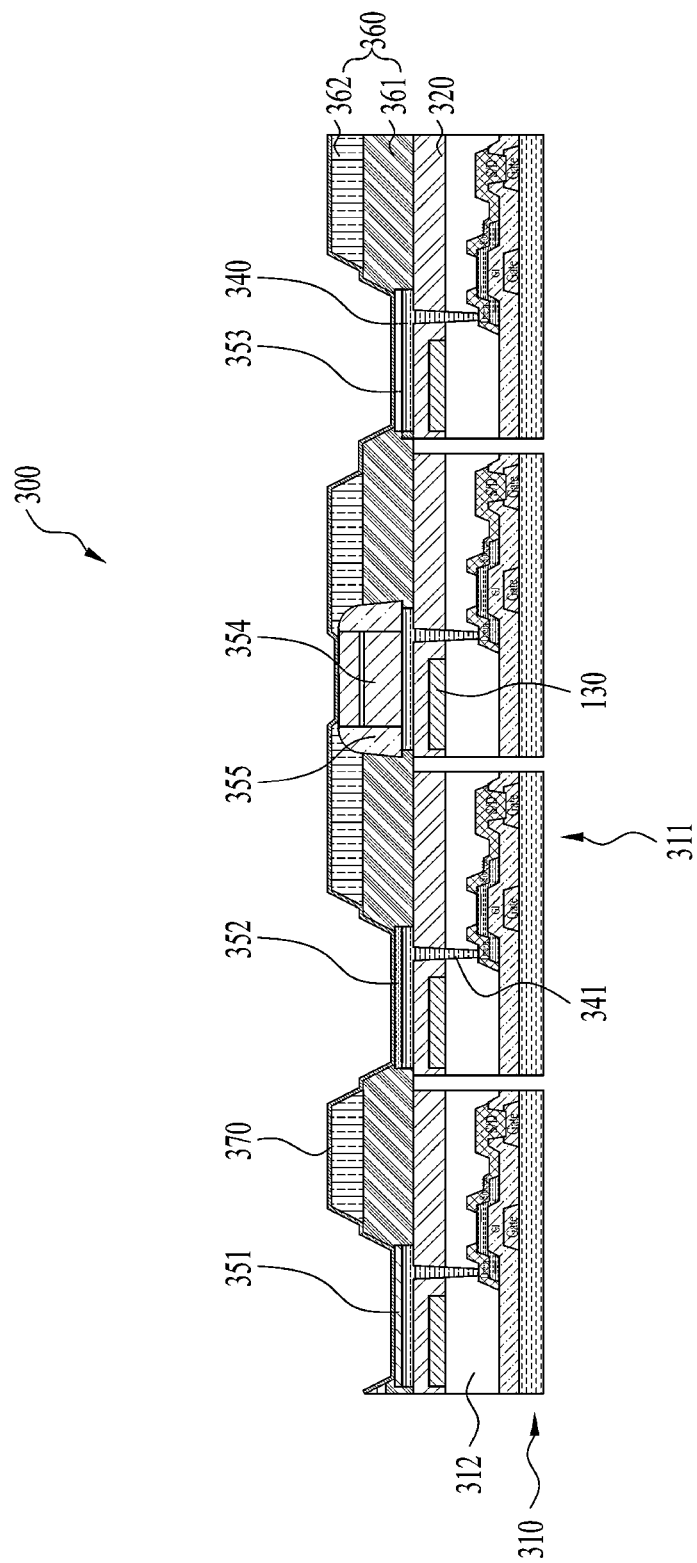

Thereafter, referring to FIG. 27, a second electrode 370, which is a common electrode that electrically interconnects the OLED subpixels 351, 352, and 353 and the LED subpixel 354, is formed.

As described above, in the case in which the first height compensation layer 361 and the second height compensation layer 362 are sequentially formed to constitute the height compensation layer 360, the second electrode 370 may be stably formed without damage thereto, such as breakage.

Figure 28:
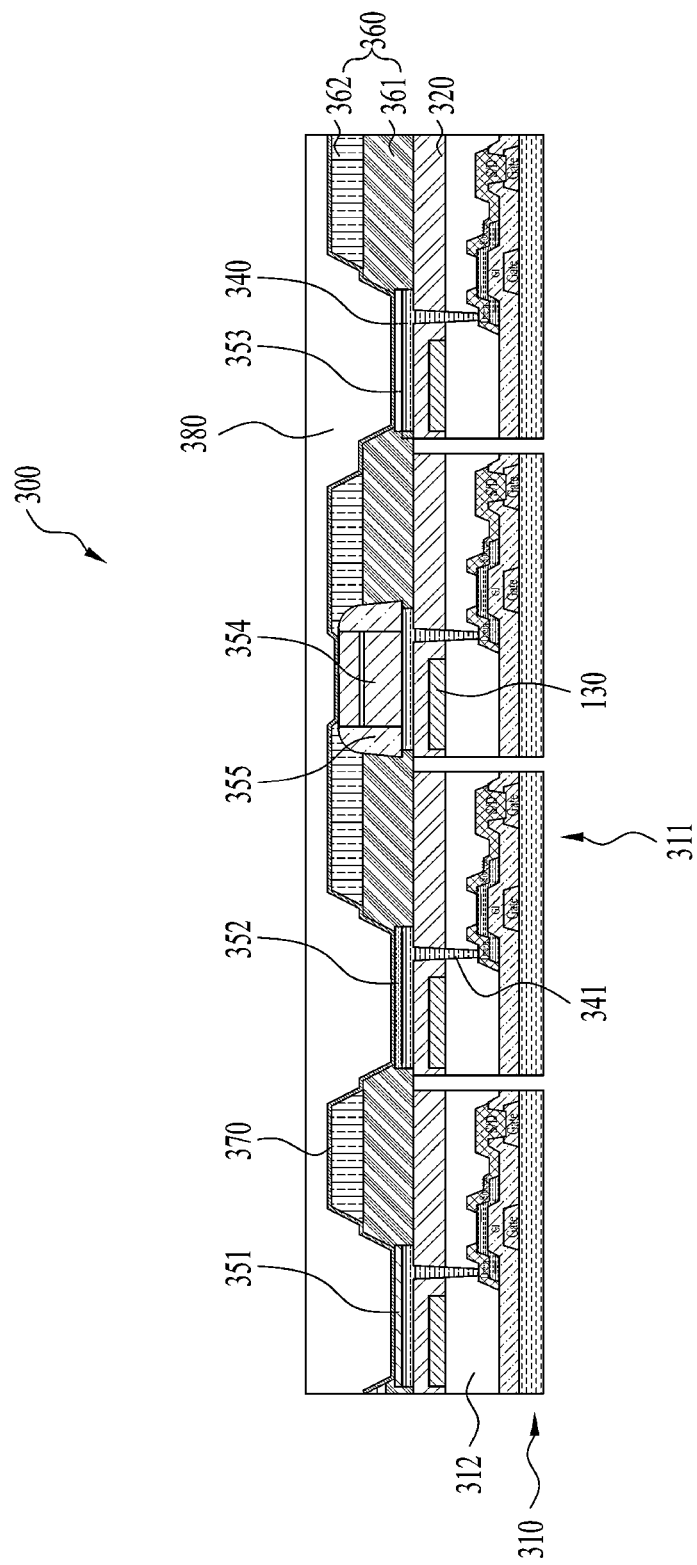

Subsequently, referring to FIG. 28, a second planarization layer 380 is formed on the second electrode 370, which is formed to be stable.

Thereafter, a light-polarizing layer 390 may be formed on a second planarization layer 380. As a result, a display device having the structure shown in FIG. 12 described above may be manufactured.

As described above, a hybrid light-emitting array structure in which an organic light-emitting diode and an inorganic light-emitting diode are arranged in combination may be provided.

A display device having such a hybrid light-emitting array structure is capable of exhibiting dramatically improved reliability while maintaining the advantages of organic light-emitting diodes.

Consequently, it is possible to overcome one of the major problems with a display device using an OLED, thereby greatly improving the productivity and quality thereof.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe the same, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

INDUSTRIAL APPLICABILITY

The present disclosure may provide a light-emitting device using a semiconductor light-emitting element having a size in micrometers (μm) and a method of manufacturing the same.

What is claimed is:

1. A display device using a light-emitting element, the display device comprising:
    a plurality of segmented first electrodes;
    a second electrode being a common electrode disposed above the first electrodes; and
    a plurality of subpixels, each of the plurality of subpixels being disposed between and electrically connected to a respective one of the first electrodes and the second electrode to constitute an individual pixel,
    wherein the plurality of subpixels comprise:
        a first subpixel configured to emit light of a first color and comprising an organic light-emitting diode;
        a second subpixel configured to emit light of a second color and comprising an organic light-emitting diode;
        a third subpixel configured to emit light of a third color and comprising an inorganic light-emitting diode; and
        a fourth subpixel comprising an organic light-emitting diode configured to emit light in which the light of the first color to the light of the third color are mixed.

2. The display device of claim 1, further comprising a conductive adhesive layer disposed on at least one side surface of the inorganic light-emitting diode.

3. The display device of claim 2, wherein the conductive adhesive layer is white or black.

4. The display device of claim 2, wherein the conductive adhesive layer comprises a dye of any one of the first color to the third color.

5. The display device of claim 1, further comprising a fifth subpixel configured to emit light of the third color and comprising an organic light-emitting diode.

6. The display device of claim 1, wherein the third color is blue.

7. The display device of claim 1, wherein at least one of the third subpixel or the fourth subpixel has a size smaller than a size of the first subpixel or the second subpixel.

8. The display device of claim 1, further comprising a height compensation layer configured to compensate for a height difference between the inorganic light-emitting diode and one of the organic light-emitting diodes.

9. The display device of claim 1, wherein a thickness of the inorganic light-emitting diode in the third subpixel is greater than a thickness of the organic light-emitting diode in any one of the first subpixel, the second subpixel and the fourth subpixel.

10. The display device of claim 1, further comprising a quantum dot layer disposed on the third sub-pixel.

11. The display device of claim 1, wherein a combined size of the third and fourth subpixels corresponds to a size of the first subpixel or the second subpixel.

* * * * *